(12) United States Patent
Herschbach et al.

(10) Patent No.: US 11,437,531 B2
(45) Date of Patent: Sep. 6, 2022

(54) PHOTODETECTOR

(71) Applicant: IEE INTERNATIONAL ELECTRONICS & ENGINEERING S.A., Echternach (LU)

(72) Inventors: Norbert Herschbach, Medernach (LU); Christian Pauly, Mersch (LU)

(73) Assignee: IEE INTERNATIONAL ELECTRONICS & ENGINEERING S.A., Echternach (LU)

(*) Notice: Subject to any disclaimer, the term of this patent is extended or adjusted under 35 U.S.C. 154(b) by 0 days.

(21) Appl. No.: 16/982,944

(22) PCT Filed: Mar. 21, 2019

(86) PCT No.: PCT/EP2019/057134
§ 371 (c)(1),
(2) Date: Sep. 21, 2020

(87) PCT Pub. No.: WO2019/180165
PCT Pub. Date: Sep. 26, 2019

(65) Prior Publication Data
US 2021/0020795 A1 Jan. 21, 2021

(30) Foreign Application Priority Data

Mar. 22, 2018 (LU) .................................. LU100743
Oct. 3, 2018 (LU) .................................. LU100953

(51) Int. Cl.
*H01L 31/0232* (2014.01)
*H01L 27/144* (2006.01)
(Continued)

(52) U.S. Cl.
CPC .... *H01L 31/02327* (2013.01); *H01L 27/1443* (2013.01); *H01L 27/1446* (2013.01);
(Continued)

(58) Field of Classification Search
CPC ....... H01L 31/02327; H01L 31/035281; H01L 31/105; H01L 31/028; H01L 27/1443; H01L 27/1446
See application file for complete search history.

(56) References Cited

U.S. PATENT DOCUMENTS 4,883,561 A 11/1989 Gmitter et al.
5,315,128 A 5/1994 Hunt et al.
(Continued)

FOREIGN PATENT DOCUMENTS

EP 0622857 A1 11/1994
GB 2383684 A 7/2003
(Continued)

OTHER PUBLICATIONS

S. Schiller et al., "Fused-silica monolithic total-internal-reflection resonator", Optics Letters 17, pp. 378-380 (1992).
(Continued)

*Primary Examiner* — Sitaramarao S Yechuri
(74) *Attorney, Agent, or Firm* — Reising Ethington P.C.

(57) ABSTRACT

A photodetector especially useful for infrared detection. The photodetector includes a two-dimensional arrangement of resonator-photodiode units disposed along a detector surface for detecting radiation incident from above the detector surface and having a target frequency ($v_t$) that corresponds to a target wavelength ($\lambda_t$) in vacuum, wherein each resonator-photodiode unit has a photodiode semiconductor structure, which is sensitive to the target frequency ($v_t$), and a subwavelength dielectric resonator.

15 Claims, 8 Drawing Sheets

(51) Int. Cl.
*H01L 31/0352* (2006.01)
*H01L 31/105* (2006.01)
*H01L 31/028* (2006.01)

(52) U.S. Cl.
CPC .... *H01L 31/035281* (2013.01); *H01L 31/105* (2013.01); *H01L 31/028* (2013.01)

(56) References Cited

U.S. PATENT DOCUMENTS

| | | |
|---|---|---|
| 2005/0045982 A1* | 3/2005 | Shenai ............... H01L 29/872 257/481 |
| 2005/0263805 A1 | 12/2005 | Mouli |
| 2009/0217972 A1* | 9/2009 | Guha ............... H01L 31/02327 136/255 |
| 2011/0180894 A1* | 7/2011 | Samuelson ........... H01L 31/105 257/438 |
| 2012/0273913 A1* | 11/2012 | Ma ...................... G01J 1/4228 257/443 |
| 2015/0053860 A1 | 2/2015 | Duane et al. |
| 2015/0255639 A1* | 9/2015 | Pelouard ............ H01L 27/142 136/246 |
| 2015/0279741 A1 | 10/2015 | Archer et al. |
| 2015/0288318 A1 | 10/2015 | Guler et al. |
| 2016/0254407 A1* | 9/2016 | Wang ................ H01L 31/107 136/256 |
| 2016/0365463 A1 | 12/2016 | Lee et al. |
| 2016/0365464 A1* | 12/2016 | Frey ................... H01L 31/107 |
| 2017/0069491 A1 | 3/2017 | Cheng et al. |
| 2018/0219110 A1 | 8/2018 | Wicks |

FOREIGN PATENT DOCUMENTS

| | | |
|---|---|---|
| WO | 2015038203 A1 | 3/2015 |
| WO | 2017019158 A1 | 2/2017 |

OTHER PUBLICATIONS

J. C. Ginn et al., "Realizing Optical Magnetism from Dielectric Metamaterials", Physical Review Letters 108, 097402 (2012).

I. Staude et al., Tailoring Directional Scattering through Magnetic and Electric Resonances in Subwavelength Silicon Nanodisks, ACS Nano 7, pp. 7824-7832 (2013).

J. van de Groep et al., "Designing Dielectric Resonators on Substrates: Combining Magnetic and Electric Resonances", Optics Express 21, 26285 (2013).

M. Decker et al., "High-Efficiency Dielectric Huygens' Surfaces", Adv. Optical Mater. 3, pp. 813-820 (2015).

N. A. Butakov et al., "Designing Multipolar Resonances in Dielectric Metamaterials", Sci. Rep. 6, 38487 (2016).

X. Liu et al., "Experimental Realization of a Terahertz All-Dielectric Metasurface Absorber", Opt. Express 25, pp. 191-201 (2017).

A. B. Evlyukhin et al., "Optical Response Features of Si-nanoparticle Arrays", Phys. Rev. B 82, 045404 (2010).

International Search Report corresponding to International Application No. PCT/EP2019/057134, dated Jul. 7, 2019, 3 pages.

Written Opinion corresponding to International Application No. PCT/EP2019/057134, dated Jul. 7, 2019, 5 pages.

* cited by examiner

PHOTODETECTOR

TECHNICAL FIELD

The invention generally relates to a photodetector.

BACKGROUND

When photons in the infrared spectral range with longer wavelength than 1.1 µm are to be detected, silicon is an inadequate semiconductor material for photon induced interband transitions, and the use of small-bandgap semiconductor materials is definitely required. Typical small-bandgap semiconductor material systems employed in the infrared photodetectors based on interband transitions are indium gallium arsenide (InGaAs) and mercury cadmium telluride (HgCdTe). Also, antimonide based systems, like indium antimonide (InSb), indium gallium antimonide (InGaSb) and indium arsenide combined with gallium antimonide (InAs/GaSb), are used, particularly to produce type II strained layer superlattice photodetector devices for infrared light detection. The production of infrared photodetector devices using these semiconductor systems is technologically complicated, and some of the materials used are highly poisonous so that strict precautions are required to prevent hazards for health and environment. Consequently, the cost level of these devices is high. In addition, these types of infrared photodetectors require cooling to low temperatures in order to achieve a low noise operation, and for the detection of light at the longer wavelengths in the mid-wavelength infrared or long-wavelength infrared range cryogenic cooling of the detector device is often necessary.

A resonant cavity photodiode, also called resonant cavity enhanced photodiode, consists in a photodiode that has an optical cavity or optical resonator integrated into it, such that the light entering the photodiode can be trapped inside the resonator when it is resonant. The optical resonator is realized typically in the form of a Fabry-Perot resonator by using two mirrors that face each other with the space between them containing the absorbing semiconductor material of the photodiode. The mirrors are typically either metal layer mirrors, dielectric mirrors or Bragg mirrors, or also distributed Bragg reflectors in layered semiconductor material structures or Bragg gratings for photodiodes in the form of waveguide photodiodes. Resonant cavity photodiodes have been described and developed for some time in different forms and as single photodetectors or in one- or two-dimensional arrays of photodetectors, see for example, EP 0 622 857 A1, GB 2 383 684A, US 2005/0263805 A1, and WO 2017/019158 A1.

Usually different combinations of reasons motivate the use of resonant photodiode concepts. As an effect of the trapping of the light in the resonant cavity the length of the path that the light propagates through the absorbing semiconductor material in multiple passes becomes effectively multiplied by a factor approximately equal to the quality factor or finesse of the optical resonator. As a consequence, the thickness and volume of the absorbing semiconductor material required to achieve a certain probability level for the absorption of an incoming light pulse is reduced accordingly compared to a photodiode without resonant cavity in which the same probability level for absorption would be achieved. This can have the advantage that the distance inside the semiconductor, which the photo-generated free charge carriers must drift before they can be extracted at the electrodes, is shorter, which in turn can be favorable for a faster response of the photodetector, and depending on the semiconductor material the reduction in recombination probability due to the shorter drift distance can also be a significant advantage. Furthermore, since the dark current and dark current noise contributions from thermal excitations that are relevant in photodiodes for the infrared spectral range are roughly proportional to the volume of the small bandgap semiconductor absorber section of the photodiode, the reduction of this volume in the resonant cavity photodiode concepts are also beneficial with respect to dark current levels and noise levels of these photodetectors. Also, semiconductor materials with absorption coefficients that are too low to realize conventional types of photodiodes may become usable when a resonant photodiode concept is employed. An important advantage of resonant cavity photodiodes is that due to the smaller absorber volume the integration of the photodiodes into integrated electronic circuits and mixed electronic and photonic circuits is easier. In particular, this advantage is relevant in chips for imaging or for optical telecommunication, where large arrays of photodiodes are integrated with electronic circuits. Furthermore, the smaller thickness of the absorbing semiconductor layer in resonant cavity photodiodes can help to reduce the so-called pixel cross-talk, that is to say, it is easier to realize arrays of resonant cavity photodiodes in which an optical signal in one photodiode in an array stays confined to that photodiode site and also the free charge carriers that are photo-generated in that photodiode do not spill over into the regions belonging to other adjacent photodiodes. Finally, the aspect of wavelength selectivity in photodetection with resonant cavity photodiodes, where the spectral region of sensitive detection can be selected with the design parameters of the optical cavity, is in some applications a major advantage.

Metamaterial concepts based on regularly structured layers of a conducting material, typically a metal, a highly doped semiconductor, a transition metal nitride or a conducting oxide, which have an interface with a dielectric layer, have also been proposed to improve photodetectors that use the photodiode principle. In the interface region of a conducting material and a dielectric or air surface plasmon polaritons (SPPs) can be excited. These excitations consist in a localized plasmon excitation in the surface of the conductor, i.e. a collective oscillation of the free charges, like a collective oscillation of free electrons in a metal, with respect to the ions of the lattice, in conjunction with an electromagnetic field in the dielectric localized at the interface region with a strong coupling between the plasmonic excitation in the conductor and the electromagnetic field in the dielectric. SPP excitations can propagate along the interface and have a wavelength that is determined by the complex permittivity of the metal, the permittivity of the dielectric and the frequency of the excitation. The SPP wavelength is considerably smaller than the wavelength of an electromagnetic wave with the same frequency travelling in the dielectric.

Structures in the conducting layer of a size in the range of the SPP wavelength can show pronounced resonances of SPP excitation, when exposed to electromagnetic fields at the resonance frequencies. For these resonant structures in the conducting layer diverse shapes may be chosen depending on the desired interaction characteristics of the structure with the incoming electromagnetic wave, see for example WO 2015/038203 A1. A resonant structure in the conducting layer can either be a patch of conducting layer with a certain shape on a dielectric layer, or it can be a cut-out hole with a certain shape in the conducting layer. These resonant structures can form so-called meta-atoms, i.e. elementary units of a size smaller than the wavelength of an incoming travelling electromagnetic wave with which they interact in a particular way, that form the basic building blocks for a metamaterial. In a metamaterial the meta-atoms can be arranged in one-, two- or three-dimensional arrays. These arrays of meta-atoms can either be regular arrays with fixed spacing periods between meta-atoms, or regular arrangements of smaller subarrays of meta-atoms with different distances between meta-atoms or also with different types of meta-atoms, or also arrays of meta-atoms or subarrays with a particular predetermined variation of the distance between meta-atoms or a particular predetermined variation of the type of meta-atom. By choosing the types of meta-atoms and with the choice of the arrangement of the meta-atoms in the array of the metamaterial the metamaterial can be engineered to have particular properties of interaction with electromagnetic waves.

Metamaterials composed of meta-atom structures for which the interaction with the electromagnetic waves involves plasmons or surface plasmons are called plasmonic metamaterials. Examples of plasmonic metamaterials that are engineered to absorb as good as possible electromagnetic radiation in a given spectral range and metamaterials that are optimized to emit thermal radiation preferentially in a particular spectral range are given in WO 2015/038203 A1. Furthermore, US 2016/365463 A1 describes examples of metamaterial structures that use meta-atoms having surface plasmon resonances and are engineered to provide a reduced reflection and an optimized transmission of light, and that are integrated into a photodiode structure in order to enhance its quantum efficiency.

Dielectric resonators are well known and are used in microwave components such as filters. Dielectric resonators are also known and are used in optics, for instance, in the form of monolithic resonators or optical cavities in which the confinement of the light is provided by total internal reflection at the surfaces of the monolithic resonator, see for example S. Schiller, I. I. Yu, M. M. Fejer, and R. L. Byer, Fused-silica monolithic total-internal-reflection resonator, *Optics Letters* 17, 378-380 (1992). Monolithic total-internal-reflection resonators can provide a high finesse and have inherently a high mechanical stability. An important aspect of these macroscopic dielectric resonators is that coupling of light into the resonator and also coupling of light out of the resonator can only be done via the evanescent field by frustrated total internal reflection at surface regions of the resonator where the total internal reflection of light in resonant modes occurs. Frustrated total internal reflection can be achieved in a controlled way with an optical waveguide or a reflection prism, for example, that is placed near the resonator surface where the evanescent field is not vanishing. Like the tunneling effect in quantum mechanics the photons can tunnel through the gap between the surface of the resonator and the surface of the optical waveguide or of the reflection prism.

Also, dielectric resonators with subwavelength dimensions for the ultraviolet, visible and infrared spectral ranges are known and have been studied extensively in the field of photonics. The expression subwavelength dielectric resonator designates a dielectric resonator with a size considerably smaller than the wavelength of a free-space traveling electromagnetic wave at frequencies in the spectral range in which the resonator should be used and show resonances. To be more precise a subwavelength dielectric resonator for a particular spectral range can be defined as a resonator which has its resonances of lowest order in that spectral range. To each of the resonant modes correspond a characteristic resonant electromagnetic field function. The resonant modes and corresponding resonance frequencies are determined by the geometry of the resonator, the electric permittivity and possibly the magnetic permeability of the dielectric material of the resonator. When a multipolar expansion of the characteristic electromagnetic field of a resonant mode is made and when it is found, for example, that the term in the multipolar expansion corresponding to the electric dipole field is dominant, then this mode may be designated as the electric dipole mode or a mode with predominantly electric dipole character. Similarly, a mode with a dominant magnetic dipole term, or a dominant electric quadrupole term, or a dominant magnetic quadrupole term in the multipolar expansion of the characteristic mode field may be designated as a magnetic dipole mode, or an electric quadrupole mode, or a magnetic quadrupole mode, respectively.

Unlike macroscopic dielectric resonators that are not of subwavelength size, for subwavelength dielectric resonators frustrated total internal reflection is not required for the coupling in and coupling out of light to and from the resonant modes inside of the resonator. The interaction of an external electromagnetic wave with subwavelength dielectric resonators is rather similar to the scattering of electromagnetic radiation by nanoparticles. The external electromagnetic field induces a polarization vector that oscillates in time in the subwavelength resonator and depending on the frequency and the direction of the polarization of the excitation field one or more resonator modes may be excited. Similarly, when a polarization vector field corresponding to a particular resonator mode oscillates in the resonator, then the resonator will radiate at a certain rate energy of the polarization oscillation in the resonator to the outside with a radiation profile characteristic of the oscillating mode. For instance, the electric dipole mode will have a radiation profile that is very similar to that of an oscillating electric dipole.

Subwavelength dielectric resonators have also been successfully employed as meta-atoms to generate diverse kinds of dielectric metamaterials, also sometimes called all-dielectric metamaterials. Unlike plasmonic metamaterials, the dielectric metamaterials do not have ohmic losses. Dielectric metamaterials can therefore be designed to have properties of interaction with electromagnetic waves that are difficult or even impossible to realize with plasmonic metamaterials. A large variety of possible geometries can be used for the subwavelength dielectric resonators that can be incorporated as meta-atoms in dielectric metamaterials. Metamaterials based on subwavelength cubic dielectric resonators have been studied by James C. Ginn and Igal Brener, David W. Peters, Joel R. Wendt, Jeffrey O. Stevens, Paul F. Hines, Lorena I. Basilio, Larry K. Warne, Jon F. Ihlefeld, Paul G. Clem, and Michael B. Sinclair, Realizing Optical Magnetism from Dielectric Metamaterials, *Physical Review Letters* 108, 097402 (2012).

The cylindrical geometry for subwavelength dielectric resonators has become particular interesting for research in dielectric metamaterials. By changing the aspect ratio of the cylinder, i.e. diameter divided by height, the resonance frequencies of the electric dipole and the magnetic dipole modes can be shifted with respect to each other and at a certain value of the cylinder's aspect ratio the resonance frequencies of the electric dipole and the magnetic dipole modes are coinciding. As a result, it is possible to excite the electric dipole mode and the magnetic dipole mode simultaneously with an incoming electromagnetic wave at the frequency coinciding with the resonance frequency of both modes. The radiated electromagnetic field resulting from the simultaneously excited electric dipole and magnetic dipole modes can be understood as the vectorial sum of the radiated electromagnetic fields of the electric dipole and the magnetic dipole mode. It turned out that in backward direction these two electromagnetic fields can cancel each other out, when they have the same magnitude, and in forward direction they add constructively resulting in a forward scattering field that in addition can have a phase shift of $2\pi$ with respect to the incoming electromagnetic wave. Consequently, subwavelength cylindrical dielectric resonators with this property lend themselves to create dielectric metasurfaces, i.e. two-dimensional arrays of meta-atoms, that are fully transparent and have practically no backscattering.

Another important aspect is that the forward scattered field can have a phase shift of up to $2\pi$ with respect to the incoming electromagnetic wave, which is important to realize so-called Huygens' metasurfaces and metasurfaces engineered to produce any desired wavefront deformation to incoming electromagnetic waves any given wavefront shape. These research results were found through numerical simulations, theoretical calculations and experiments by several scientists and described in scientific publications of which the following few citations contain the essential aspects: Isabelle Staude, Andrey E. Miroshnichenko, Manuel Decker, Nche T. Fofang, Sheng Liu, Edward Gonzales, Jason Dominguez, Ting Shan Luk, Dragomir N. Neshev, Igal Brener, and Yuri Kivshar, Tailoring Directional Scattering through Magnetic and Electric Resonances in Subwavelength Silicon Nanodisks, ACS Nano 7, 7824-7832 (2013); J. van de Groep and A. Polman, Designing dielectric resonators on substrates: Combining magnetic and electric resonances, Optics Express 21, 26285 (2013); Manuel Decker, Isabelle Staude, Matthias Falkner, Jason Dominguez, Dragomir N. Neshev, Igal Brener, Thomas Pertsch, and Yuri S. Kivshar, High-Efficiency Dielectric Huygens' Surfaces, Adv. Optical Mater. 3, 813-820 (2015); Butakov, N. A. and Schuller, J. A. Designing Multipolar Resonances in Dielectric Metamaterials, Sci. Rep. 6, 38487 (2016).

Xinyu Liu, Kebin Fan, Ilya V. Sharivov, and Willie J. Padilla, Experimental realization of a terahertz all-dielectric metasurface absorber, Opt. Express 25, 191-201 (2017) describes the engineering of a dielectric metasurface based on cylindrical dielectric resonator meta-atoms that can near to completely absorb terahertz radiation within certain bandwidth and reports on the realization of laboratory samples of this type of metasurface and their experimental characterization.

An important aspect of arrays of dielectric resonators which have a separation between the resonators that is smaller than or on the same order than the wavelength, as it is the case for the dielectric metamaterials described in the scientific literature cited above, is the interaction between the dielectric resonators in the array. Evanescent fields and scattered or radiated field contributions from each dielectric resonator in the array affect the field in the other resonators in the array and vice-versa. These different field contributions add and interfere with each other in every point in the array of dielectric resonators and result in collective effects in the array of resonators that can significantly determine the interaction of the array of resonators with an external electromagnetic wave. These collective effects of interaction may also be described as multiple scattering effects in the resonator array. The collective effects or multiple scattering effects depend sensitively on the frequency of the external electromagnetic wave, the distance between the dielectric resonators in the array, the permittivity and possibly the permeability of possible embedding media between, underneath and on top of the resonators, and finally the resonator modes excited by the external electromagnetic wave in the individual dielectric resonator, in particular, the multipole character of the modes' characteristic fields and the strength of the resonant response of the individual resonator in an external field.

In Andrey B. Evlyukhin, Carsten Reinhardt, Andreas Seidel, Boris S. Luk'yanchuk, and Boris N. Chichkov, Optical response features of Si-nanoparticle arrays, Phys. Rev. B 82, 045404 (2010), a theoretical description of the multiple scattering effects of arrays of periodically arranged dielectric resonators, in which only an electric dipole mode and a magnetic dipole mode can be excited in each individual resonator by an external electromagnetic wave, is given. Based on the coupled-dipole equations conditions for the resonant response of a periodic two-dimensional array of interacting resonators are derived and expressions for the electromagnetic field as well as for the reflection and transmission coefficients of the array are given. With the introduction of effective electric and magnetic polarizability functions for the array that include the coupling between resonators it was possible to obtain closed form expressions for the response of infinite two-dimensional resonator arrays. The expressions for the array resonance conditions clearly show that additional resonances appear due to the diffraction coupling between the resonators. In Evlyukhin et al., the results of the theoretical approach are applied to arrays of spherical silicon nano-particles for the case of infinite two-dimensional arrays as well as for finite arrays of different sizes. The calculations show the different effects caused by the coupling between resonators, for example, frequency shifts and changes in the width of resonant features in the extinction cross section spectra or the appearance of additional resonant features, when the distance between resonators in the array are varied.

Obviously, with the interaction between resonators the array of dielectric resonators becomes a much more complicated system than would be an array of resonators that respond independently to an external electromagnetic wave excitation. The theoretical approach of Evlyukhin et al. can only show a part of the complexity of systems of arrays of subwavelength dielectric resonators, since it is based on the simplifying assumptions that the characteristic fields of the resonant modes of the individual dielectric resonators are pure electric or magnetic dipole fields, and that the size of the resonators is small compared to the distance between the resonators. Both assumptions may be quite restrictive with respect to the choice of the geometry of the subwavelength dielectric resonator as well as with respect to the distance between the resonators in the array if quantitatively precise calculations of more varied dielectric resonator geometries and array spacings are required. A qualitative understanding of the interaction effects, however, can be obtained from the theoretical approach of Evlyukhin et al. To make quantitatively valid predictions on the response to external electromagnetic waves for more general systems that do not fulfill well the mentioned assumptions, numerical methods, like finite-element methods or finite-difference-time-domain methods, are used to solve the Helmholtz equation for those systems. Results of numerical simulations of this kind on the absorbance spectra of an array of cylindrical silicon dielectric resonators as a function of the distance between the cylinders in the array are given in Liu et al.

SUMMARY

It is thus an object of the present invention to provide an improved photodetector, especially for infrared detection.

This problem may be solved by a photodetector according to claim 1.

The invention provides, in at least some embodiments, a photodetector, comprising a two-dimensional arrangement of resonator-photodiode units disposed along a detector surface for detecting radiation incident from above the detector surface and having a target frequency that corresponds to a target wavelength in vacuum. As will be explained later, the two-dimensional arrangement may be a regular arrangement, which can also be referred to as an array, or a non-regular arrangement. The resonator-photodiode units and the photodetector as such can be adapted to detect ultraviolet light, visible light or, preferably, infrared light. The photodetector is configured to detect light at a target frequency, which corresponds to a target wavelength in vacuum. More specifically, the target wavelength is the wavelength of a free-space travelling electromagnetic wave in vacuum that has the target frequency. While reference is made to "a" target frequency, it is understood that the incident light generally comprises a plurality of frequencies and the photodetector is also normally adapted not only to detect a single target frequency but a frequency band or frequency range centered at a target frequency. Insofar, "a target frequency" is to be understood as "at least one target frequency". The resonator-photodiode units are disposed along a detector surface, which is normally a detector plane and thus planar, but could also be curved and/or angled. The detector surface may correspond to a physical surface of the photodetector, e.g. to an boundary surface between the photodetector and an adjacent space containing vacuum, air or any other medium. In general, however, the detector surface is to be understood as a geometrical surface that describes the general shape of the two-dimensional arrangement, and it does not have to be a boundary surface. At least in some embodiments, one could also say that the resonator-photodiode units are disposed in or on the detector surface. The direction from where radiation can be detected is defined as "above" the detector surface, and terms like "over", "above", "under", "below" or "underneath", when used in the following, are to be understood in the context of this definition. It is understood that this does not imply any specific orientation of the photodetector with respect to gravity.

Each resonator-photodiode unit comprises a photodiode semiconductor structure, which is sensitive to the target frequency, and a subwavelength dielectric resonator. Each resonator-photodiode unit could also be referred to as a "subwavelength dielectric resonator and photodiode unit". For sake of brevity, the resonator-photodiode units are in the following sometimes simply referred to as "units". The absorbent material of the photodiode semiconductor structure is sensitive to the target frequency. In other words, it is adapted to generate free charge carriers when absorbing quanta of an electromagnetic field at the target frequency. These photo-generated free charge carriers can then be extracted from the absorbent material of the photodiode semiconductor structure and can form a photocurrent, which is proportional to the rate at which the free charge carriers are generated. In order to extract the photo-generated free charge carriers and generate a photocurrent, each resonator-photodiode unit comprises or is connected to a pair of electrodes, which may be referred to as p-electrode and n-electrode. Preferably, the target frequency multiplied by the Planck constant is at least as large as a bandgap energy of the absorber material of the resonator-photodiode unit. In other words, the quanta of an electromagnetic field at the target frequency have sufficient energy to cause interband transitions that result in the formation of electron-hole-pairs bound together in the form of excitons.

The subwavelength dielectric resonator comprises or is made of a highly resistive semiconductor material or an intrinsic semiconductor material, which can function as a dielectric material over a large frequency range that includes the target frequency. In general, a variety of electromagnetic modes can be excited in the subwavelength dielectric resonator by an external electromagnetic wave. As explained above, a dielectric resonator can be called a subwavelength dielectric resonator in a particular spectral range if the frequencies of the lowest order resonant modes of this dielectric resonator are contained in that particular spectral range. The spectral range of the lowest order modes can be understood to contain at least the spectrum of the lowest order mode of lowest frequency and frequencies up to at least 2 or 3 times the frequency of that lowest order mode of lowest frequency. In the context of the described embodiments the target frequency will also be contained in the spectral range of the lowest order modes of the subwavelength dielectric resonators. It follows that the size of the subwavelength dielectric resonator is smaller than the target wavelength. The frequencies of the lowest order resonance modes of course depend on several parameters like the electric permittivity and magnetic permeability of the dielectric material of the resonator, the geometric shape and the dimensions of the resonator. In addition, the values are influenced by the electric permittivity and the magnetic permeability of the media that possibly surround the resonator in the horizontal direction as embedding dielectric material, on the bottom as substrate dielectric material, and possibly on top as a covering dielectric material. In this context, the lowest order resonant modes can have their resonance frequencies in the range of the target frequency, i.e. in the spectral range of electromagnetic radiation in which the photodetector has a significant level of sensitivity. However, as will be explained below, the arrangement as a whole may have at least one collective mode with a resonance frequency in the abovementioned frequency range, which may in general differ from the frequencies of the resonant modes of a single resonator. The geometry of the dielectric resonator can be chosen in various ways, as will be discussed later.

In general, numerical simulations are required to determine the spectrum of the lowest order modes of a single subwavelength dielectric resonator. For simple dielectric resonator geometries, e.g. for the cylindrical geometry, also analytic approaches can be used to obtain approximate expressions that relate geometry parameters of the resonator and the resonator material's electric permittivity to the resonance frequency of a lowest order modes of the resonator. To give an example we apply the expressions given by Liu et al. for cylindrical dielectric resonators to the case of a resonator dielectric material with a refractive index n of 4.2, corresponding to relative electric permittivity of $n^2=17.6$, and assuming that the relative electric permittivity of the dielectric materials that embed the resonator, support and cover it are all unity. Requiring further that the lowest order electric dipole mode has its resonance frequency f at 190 THz, corresponding to a vacuum wavelength of 1579 nm, the height $$h = \frac{c}{2\pi f} = 188 \text{ nm}$$

and the radius $$r = 3.83 \frac{c}{2\pi f \sqrt{(n^2 - 1)}} = 236 \text{ nm}$$

for the resonator dimensions are obtained with c being the speed of light in vacuum. This example together with the approximate expressions for the cylinder radius and height show that the dimensions of subwavelength dielectric resonators are much smaller than the vacuum wavelength corresponding to the frequencies of lowest order resonant modes.

A single resonator-photodiode unit already can be expected to have advantages for the detection of radiation at frequencies close to its resonance frequencies that are very similar to the advantages obtained in resonant cavity photodiodes and that are due to the resonant enhancement of the electromagnetic field intensity in the photodiode absorber material that leads to an increased electron-hole pair generation rate and an increased photocurrent. For the photodetector disclosed herein, however, the detection efficiency is decisively increased beyond that by purposefully designed two-dimensional arrangements of resonator-photodiode units. Apart from increasing the sensitive area of the photodetector, these arrangements aim to exploit the interactions between the constituting resonator-photodiode units and the resulting collective effects in the arrangements for two main purposes. These purposes are the reduction of the backward and sideward scattered power fraction of an electromagnetic wave impinging on the photodetector, and the increase of the absorbed power fraction in particular regions of the semiconductor structure relevant for the photo-generation of free electron-hole pairs by interband transitions. To achieve these two main purposes the spectral electromagnetic mode characteristics of the individual resonator-photodiode units are purposefully chosen by adapting the unit's geometry and material composition, and a geometry of the arrangements of units in the arrangement is chosen with respect to the symmetry at a unit's site and the distances between neighboring units that optimizes the desired collective effect. How these choices for the geometry parameters of the units and of their array arrangement can be arrived at will be explained in more details in the following paragraphs below.

If one considers e.g. a regular arrangement of resonator-photodiode units, it is clear from the theory of diffraction gratings that with a choice of a spatial period smaller or equal to the target wavelength, all diffraction orders other than the zeroth order are suppressed. The remaining zeroth order backscattering, i.e. the specular reflection, of an incoming electromagnetic wave at the two-dimensional arrangement can then be further minimized by the choice of the resonant modes of the subwavelength dielectric resonators, for example, using the approaches described in Evlyukhin et al. and Staude et al. These measures to reduce the backscattering from the structure also readily increase the electromagnetic field amplitude inside the arrangement.

Further enhancements of the electromagnetic field amplitude in the array structure can be gained through the coupling between the resonator-photodiode units. Thus, it is preferred that the arrangement has a collective mode at the target frequency, in which a plurality of subwavelength dielectric resonators are coupled via electromagnetic fields. The collective mode is a resonant mode that involves a plurality of subwavelength dielectric resonators, preferably all subwavelength dielectric resonators. These resonators are coupled via electromagnetic fields that are not limited to the location of the respective single resonator, but also extend into the space between the resonators. The coupling between the resonators (or the units, respectively) can stem from evanescent field contributions of resonant modes that extend beyond the volume of a subwavelength dielectric resonator. Evanescent fields are oscillating in the vicinity of the dielectric resonator and are falling off in amplitude exponentially with increasing distance from the resonator with the wavelength being the decay length, but they are not travelling wave fields that can transport energy. If the distance between a subwavelength dielectric resonator and its neighbors is e.g. smaller or on the order of a wavelength, the evanescent fields of one resonator have considerably large amplitudes at the location of neighboring resonators and electromagnetic field energy can be exchanged between resonators in a similar way as in the frustrated total internal reflection phenomenon. Also, radiated or scattered electromagnetic field contributions from each unit can lead to a coupling between resonators. Scattered or radiated electromagnetic fields are travelling wave fields. At each resonator unit in the array, the electromagnetic waves that are scattered or radiated sideward from the other resonator units sum up and add to the external excitation field.

Due to the coupling between resonator-photodiode units via evanescent fields and field contributions that are scattered or radiated at the individual units, not only complicated inference patterns in the electromagnetic field in the two-dimensional array structure can result, but also complex collective resonant phenomena arise that cannot be easily understood. The interaction between the resonator-photodiode units and resulting collective resonant phenomena can also be described as coherent multiple scattering phenomena. However, for simplicity one may view these collective resonant phenomena as resonant modes of the entire two-dimensional array structure with proper resonance frequencies and characteristic resonant mode electromagnetic fields that are determined by a variety of factors. These factors may include the resonant modes of the individual resonator-photodiode units, the geometry parameters of the two-dimensional arrangement, and the relevant material parameters, like the electric permittivity values of the different constituents of the structure, of the individual subwavelength dielectric resonators, of the p- and n-doped regions of the photodiode semiconductor structure, of the contacting electrodes, of the possible embedding media between the subwavelength dielectric resonators, and of the other dielectric media below and possibly on top of the units. The level of complexity of the interacting system of resonator-photodiode units requires the use of numerical simulations of the response of the structure to an external electromagnetic wave excitation. Methods like the finite-element methods, the finite-difference-time-domain methods, or also T-matrix methods can be employed to obtain quantitative predictions of the response of the two-dimensional arrangement of units and of the electromagnetic field inside and outside of the structure.

With the inventive photodetector, it is preferred to take advantage of the collective effects in the response of the array of units to an electromagnetic wave excitation in a way that yields an enhancement of the electromagnetic field amplitude in particular regions of the two-dimensional arrangement of resonator-photodiode units, namely, those corresponding to the zones in the semiconductor structure relevant for the photo-generation of electron-hole pairs that can result in a usable photocurrent. This can be achieved by making appropriate choices for the resonant mode structure of the individual subwavelength dielectric resonators, for the array structure lattice symmetry (if the arrangement is a regular lattice) and distances between the resonator-photodiode units in the arrangement. Furthermore, this may depend on the materials that constitute the different components of the photodetector, including possible embedding media and/or a support substrate of the structure. These appropriate choices can be found in an iterative procedure that involves stepwise adaptations of the geometry parameters and possibly of the material composition of the structure as well as repeated numerical simulations of the response of the structure to an electromagnetic field excitation. By the collective mode of the arrangement, the relative absorption can become decisively increased, even by orders of magnitude, compared to the relative absorption obtained with a single unit. The relative absorption in a single isolated unit can be a few percent to maybe 10 percent, while when placed in an appropriate array arrangement the relative absorption can be 50 to 100 percent.

It should be noted that it is not at all trivial to arrive from a "perfect absorber based on dielectric metamaterials", as described by Liu et al., at a photodetector such as disclosed herein, which still functions as a very good absorber and also provides a photodiode functionality that is realized on the nano scale together with a network of electrode circuitry that is required to extract the photo-generated free electron-hole pairs. One difficulty is, for example, that the introduction of a conducting material like an electrode into a purposefully designed photonic structure will inevitably have a strong effect on the interaction of the electromagnetic field with the material structure. This in turn influences and could even prevent the formation of a particular collective resonant mode of the entire structure on which the localized enhancements of the electromagnetic field are based.

It is understood that in reality, the size of the arrangement of resonator-photodiode units is finite, wherefore edge effects will occur. For example, resonators located at the border of the arrangement can simply radiate or scatter electromagnetic energy sidewards out of the arrangement, because at the edge some neighbor resonators and the interactions with them are missing. Due to the lack of interaction with neighbor resonator-photodiode units and consequently the loss of the benefits of this interaction and of the cumulative scattering effects from more resonators in the external electromagnetic wave, the main edge effects are clearly that the sidewards scattering or radiation is increased, that unlike in the regions away from the border of the arrangement, the backscattering is increased on the edges, and that the enhancement of the electromagnetic field amplitude inside of the structure can be reduced towards the edges of the arrangement.

However, it has been shown that these edge effects quickly play a minor role regarding the overall performance of the photodetector when the size of the arrangement (or rather, the number of units in the arrangement) is increased. For medium sized arrangements (e.g. arrays) of 10 by 10 units and larger arrangements, side effects are practically insignificant. Numerical simulations show that already relatively small arrays of 5 times 5 resonator-photodiode units of appropriately composed structure have a significantly increased resonant enhancement of the electromagnetic field amplitude inside of the relevant regions of the photodetector, a substantially increased absorption and reduced backscattering in their response to an external electromagnetic wave excitation. Therefore, also embodiments using relatively few resonator-photodiode units can already be expected to show all the same benefits. In particular, the arrangement may comprise between 20 and 200 resonator-photodiode units or between 50 and 100 resonator-photodiode units. In addition, edge effects can also be mitigated to some degree by using different distances between units towards the edge of the arrangement and by employing different types of resonant units in the border regions of the arrangement.

Due to the electromagnetic field enhancement effect inside of the semiconductor material that is provided by the disclosed photodetector, the absorption probability can effectively be increased Since the absorption of photons and the photo-generation of electron-pairs in interband transitions are resonantly enhanced and occur in resonator-photodiode units that are small, the rate of thermally generated electron hole-pairs and the corresponding dark current, which are proportional to the photo-active volume of the semiconductor structure, are reduced compared to the photo-generation of electron-hole pairs and the corresponding photocurrent. Hence, an improved signal-to-noise ratio can be expected for the photodetector at a given temperature.

Semiconductor materials which have a smaller absorption coefficient in the relevant wavelength range (at or near the target wavelength) and which would not be absorbing sufficiently to be useful in a photodiode of a conventional structure, can, due to the resonant enhancement of the electromagnetic field amplitude in the inventive photodetector, be employed to obtain an efficient photodetection. Hence, the spectral range of usefulness of absorbing photodiode semiconductor structure materials can be extended.

Semiconductor materials with larger refractive index, which would be less interesting for use in conventional photodiodes because of the large reflection loss, can preferably be used in the inventive photodetector. The drawback of large back-reflection losses does not occur, since the photodetector can be adapted with respect to the resonant electromagnetic modes such that the backscattered or reflected power is minimized without the need of an anti-reflection coating.

Furthermore, due to the resonant enhancement of the absorption, a smaller amount of absorbing semiconductor material is needed for the production of the photodetector, which is particularly relevant when poisonous or expensive materials have to be used.

Preferably, the photodiode semiconductor structure is a p-i-n photodiode semiconductor structure having an intrinsic region made of intrinsic semiconductor material, a p-region made of p-doped semiconductor material and an n-region made of n-doped semiconductor material, the p-region and the n-region forming a p-i and an n-i semiconductor junction, respectively, with the intrinsic region. Electron-hole-pairs can be generated in the intrinsic region and can be separated by the built-in electric field generated between the p-region and the n-region. In this embodiment, the resonator is normally at least partially formed by the intrinsic region. One could also say that a resonator body of the subwavelength dielectric resonator comprises the intrinsic region. Generally speaking, the resonator body defines the space where a resonant mode is mostly located or has its maximum intensity. This resonator body is often referred to as "the resonator" as such, although the resonator, strictly speaking, is defined by the resonator body and by the surrounding material (whether this is a solid material or air). In some embodiments, the resonator body can essentially coincide with the intrinsic region of the photodiode semiconductor structure and is made of one type of dielectric material that also functions as intrinsic or highly resistive semiconductor material of the intrinsic region. In other embodiments, the p-region and/or the n-region can also form part of the dielectric resonator body, and it is also possible that the semiconductor material composition is different in the different regions of the photodiode semiconductor structure that may be counted as being more or less part of the subwavelength dielectric resonator (or the resonator body, respectively). It should be borne in mind that the characteristic electromagnetic field of a resonant mode of the dielectric resonator does not end abruptly at an interface surface from one semiconductor region to another semiconductor region or e.g. to a dielectric medium embedding the dielectric resonator or to air, but it extends typically beyond that interface into the adjacent region. Although an individual resonator-photodiode unit comprises a proper subwavelength dielectric resonator with predetermined resonant modes and a photodiode semiconductor structure, it is important to note that its composition and its geometry may also be adapted to realize a particular resonant mode (collective mode) that is proper to the system of two-dimensional arrangement of units through the interaction between units, which results in a collective resonant response of the entire structure to an electromagnetic wave excitation.

The small size of the resonator-photodiode units can also lead to faster photodetectors because of the shorter transit times and smaller drift distances required for photo-generated charge carriers in the photodiode semiconductor structure, and large drift electric fields are easily achieved due to the large built-in electric field even with relatively low dopant concentration levels in the n-region and p-region.

Semiconductor materials with a low concentration of free charge carriers can be used as a dielectric to form the dielectric resonator(s). A low concentration of free charge carriers ensures that the ohmic losses, i.e. the losses of electromagnetic field energy due to free carrier absorption induced by intraband transitions in the semiconductor, are small. Since the subwavelength dielectric resonator—or rather, the resonator body—preferably at least forms a part of a photodiode semiconductor structure that efficiently converts electromagnetic wave power into a photocurrent, the absorption of photons caused by interband transitions should dominate over absorption due to intraband transitions. While interband transitions produce free electron-hole pairs with which the photocurrent is generated in the photodiode semiconductor structure, intraband transitions cause heating of the semiconductor material. Intrinsic semiconductor materials that are typically used for the intrinsic zone of conventional semiconductor photodiodes of p-i-n type have sufficiently small intraband absorption coefficients compared to their respective interband absorption coefficients so that they are also suitable for the use in the intrinsic regions of the photodiode semiconductor structures disclosed herein.

The choice of the semiconductor material system is primarily determined by the spectral range in which the photodetector should be sensitive. The bandgap energy is the fundamentally relevant material parameter that determines the spectral range in which the absorption coefficient for interband absorption is non-zero. Typical examples for intrinsic semiconductor materials that may be used in the photoconductor are silicon (Si) for the ultraviolet, visible and near-infrared ranges, germanium (Ge) and indium gallium arsenide (InGaAs) for the near-infrared and short-wavelength infrared spectral ranges, lead sulfide (PbS) for the short-wavelength infrared range, lead selenide (PbSe) for the mid-wavelength infrared range and mercury cadmium telluride (HgCdTe) for the short-wavelength, mid-wavelength and long-wavelength infrared spectral ranges. It is also an advantage of this invention that, because of the resonant enhancement of the electromagnetic field amplitude inside of the semiconductor structure, it enables the use of semiconductor materials which have in the spectral range of interest, i.e. at and/or near the target frequency, an absorption coefficient that would usually be considered to be too small, e.g. when conventional photodetector concepts based on the photodiode principle were employed.

Semiconductor material combinations that can be used to form the p-i-n structure in a subwavelength dielectric resonator and photodiode unit are manifold. For example, in the technologically relevant wavelength range around 1.5 µm, for the intrinsic region of the p-i-n structure Ge, GaSb or $In_{0.53}Ga_{0.47}As$ may be used, since the bandgap energy of these semiconductors is conveniently in the range from 0.65 eV to 0.75 eV. The semiconductor materials for the p- and n-regions of the structure are typically chosen according to their compatibility with the material used for the intrinsic region in terms of lattice constant, bandgap energy, and work function. In this way, band discontinuities at the two interfaces, p-i and i-n, can be lifted and the bands can connect smoothly in the interface regions. In addition, if the p-i-n semiconductor structure of the resonator-photodiode unit is a stack oriented in the propagation direction of the incoming electromagnetic wave, it has to be taken into account that the front doped semiconductor region in the stack that is hit first by the incoming radiation should preferentially be transparent for the light in the wavelength range of interest. Hence, the bandgap energy of that region should be larger than the photon energy of the incoming radiation (i.e. the target frequency times the Planck constant). When, for example, Ge with a bandgap energy of 0.66 eV is used for the intrinsic region, the front region may, for example, consist in n-doped Si or n-doped GaAs, since both materials have, with 1.11 eV and 1.43 eV respectively, considerably larger bandgap energies than Ge. For the p-region p-doped Ge can be used as it is located at the backside. As a further example of a suitable material combination, one can consider using GaSb with bandgap energy of 0.68 eV as material for the intrinsic region, and a good p-i-n structure may be formed with p-doped GaSb and n-doped AlSb with bandgap energy of 1.6 eV for the p- and n-region, respectively, since the n-type AlSb has a larger bandgap energy than the intrinsic GaSb. A third example for a suitable material combination for the formation of a p-i-n stack could be p-doped InP for the p-doped region, $In_{0.53}Ga_{0.47}As$ for the light absorbing intrinsic region and n-doped InP for the n-doped region, where the bandgap energy of InP is with 1.27 eV sufficiently larger than the bandgap energy of $In_{0.53}Ga_{0.47}As$, which is 0.75 eV.

The resonator-photodiode units are disposed as a two-dimensional arrangement. At least in some embodiments, the two-dimensional arrangement can also be referred to as a two-dimensional array. The resonator-photodiode units are normally disposed in a spatially periodic two-dimensional arrangement. In this case, the arrangement of the resonator-photodiode units can be made according to the five possible Bravais lattice types, i.e. square lattices, rectangular lattices, general oblique (monoclinic) lattices, centered rectangular lattices and hexagonal lattices. Lattice arrangements having more than one resonator-photodiode unit in the unit cell can also be used and thereby lattice types that are not Bravais lattices, like a honeycomb lattice, can be realized. Beyond the periodic lattice arrangements, it is also possible to use arrangements of resonator-photodiode units that are ordered but lack translational symmetry, as realized in quasiperiodic crystal structures and aperiodic tilings like Penrose tilings. One simple, preferred arrangement of the resonator-photodiode units corresponds to a square lattice. There are, however, various modifications possible. For example, since subwavelength dielectric resonators can be considerably smaller than a wavelength, it is also possible to combine resonator-photodiode units in small groups in a way that each of the resulting groups represent an individual resonant structure which has particular desired radiation or scattering properties. Arranging such groups in a two-dimensional arrangement represents a further way to generate an array structure of resonator and photodiode elements that shows a collective resonant response to an external electromagnetic wave excitation. Also, different types of dielectric resonators, i.e. different types of resonator-photodiode units, can be combined within the array. The different types may be chosen for having particular individual resonant mode spectra and individual radiation or scattering properties. Through the mutual interaction between individual resonator-photodiode units in the two-dimensional arrangement, this can result in an improved response with respect to an external electromagnetic wave excitation and can thus give additional freedom to adapt the composition of the array structure and to optimize the performance of the photodetector. Similarly, additional freedom in the array structure composition and possibly improved photodetector performance can be expected when ordered but aperiodic arrangements of different types of resonator-photodiode units or groups of resonator-photodiode units according to certain aperiodic tiling patterns or quasicrystal structures are employed.

The distance between neighboring units, which in the case of a periodic arrangement of the array is given by the lattice parameter of that array (i.e. the distance from center to center between two neighboring units in the array), should preferentially be smaller or on the order of the target wavelength. At maximum, it should be twice the target wavelength. For lattice parameters larger than twice the target wavelength, the contribution to the enhancement of the electromagnetic field inside of the resonator-photodiode units, which is due to the coupling effects between the units in the array, i.e. collective resonant effects, is decreased to a low level.

When seeking to achieve a certain collective resonant mode response of a two-dimensional array of subwavelength dielectric resonator and photodiode units, it can also be beneficial to use different types of resonator-photodiode units chosen for having particular individual resonant mode spectra and individual radiation or scattering properties. This can result through the mutual interaction between units in the two-dimensional arrangement in an improved response with respect to an external electromagnetic wave excitation and can thus give additional freedom to adapt the composition of the array structure and to optimize its performance as a photodetector. Since subwavelength dielectric resonators can be considerably smaller than a wavelength, it is also possible to combine subwavelength resonators in small groups in a way that each of the resulting groups represent an individual resonant structure which has particular desired radiation or scattering properties. Arranging such groups in a two-dimensional arrangement represents a further way to generate an two-dimensional structure of resonator-photodiode units that shows a collective resonant response to an external electromagnetic wave excitation.

There are also various possibilities for the shape of the resonator body. For example, a shape of the resonator body may correspond to a cube, a rectangular parallelepiped or a cylinder. Normally, this refers to the shape of the intrinsic portion. The size and the proportions of the resonator can be optimized to allow for a specific resonance behavior of the individual resonator and a specific coupling to neighboring resonators. In particular, the resonator body (or the intrinsic portion, respectively) may have the shape of a cylinder with its symmetry axis perpendicular to the detector surface. As has already been explained above, by changing the aspect ratio—diameter divided by height—of the cylinder, the resonance frequencies of the electric dipole and the magnetic dipole modes can be shifted with respect to each other and at a certain value of the cylinder's aspect ratio, these resonance frequencies are coinciding. As a result, it is possible to excite the electric dipole mode and the magnetic dipole mode simultaneously, wherein the corresponding radiated electromagnetic fields can cancel each other out in backward direction when they have the same magnitude, and in forward direction they add constructively resulting in a forward scattering field that in addition can have a phase shift of $2\pi$ with respect to the incoming electromagnetic wave. Although these properties have been described with respect to a cylindrical resonator, it is conceivable to achieve them for resonators having a different geometry. Apart from the abovementioned forms, the resonator body may have a different, e.g. more complex form. The choice of the form may depend on various aspects, in particular the desired spectral distribution of resonant modes, the desired interaction between resonators in the array, and the realization of the photodiode semiconductor structure and the connection to electrodes and the electrodes' circuits.

Normally, the p-region is connected to a p-electrode and the n-region is connected to an n-electrode, which p-electrode and n-electrode are adapted for extracting photo-generated free charge carriers from the p-i-n photodiode semiconductor structure. Each of the electrodes may at least partially be made of metal. In some embodiments, it can be beneficial if at least a part of the electrode is transparent for the radiation to be detected by the photodetector. Combinations of metal and non-metal materials may be used for each of the electrodes. Examples for metal electrode materials are aluminum (Al), silver (Ag), gold (Au), platinum (Pt), titanium (Ti) and tungsten (W). For transparent electrodes, material examples can be found among the p- and n-type transparent oxides such as $ZnRh_2O_4$, $AlCuO_2$, $SrCu_2O_2$ for the p-type and $In_2O_3$, $ZnO$, $SnO_2$ for the n-type.

Regarding the connection of the p-i-n photodiode semiconductor structure to the conducting electrodes, an ohmic contact between the n-region, respectively p-region and the n-electrode, respectively p-electrode is highly preferable. In particular, the p-region can be connected to a p-electrode via a p+-portion and the n-region can be connected to an n-electrode via an n+-portion, wherein the p+-portion and n+-portion have an increased dopant concentration and the p-electrode and n-electrode are adapted for extracting a photocurrent from the p-i-n photodiode semiconductor structure. The p+-region may also be regarded as a part of the p-region having an increased dopant concentration and the n+-region may be regarded as a part of the n-region having an increased dopant concentration, or more specifically, the p+-region and n+-region have larger concentrations of acceptor or donor atoms, respectively.

There are various possibilities regarding the geometric arrangement of the different regions with respect to each other. According to one embodiment, the p-region and the n-region are disposed on opposite sides of the intrinsic region along a direction perpendicular to the detector surface. In other words, one of the p-region and the n-region is disposed above the intrinsic region and the other is disposed below the intrinsic region. In this context, it is preferred that the region disposed above the intrinsic region as well as an electrode connected to it are transparent for the relevant electromagnetic radiation.

According to one embodiment, a plurality of resonator-photodiode units are connected by a common p-region. In other words, the individual intrinsic regions of different resonator-photodiode units are connected to a single p-region. This p-region may for example be disposed below the intrinsic regions and could extend along a major part of the detector surface. In some cases, it may be easier to produce a large, single p-region than a multitude of individual p-regions, one for each resonator-photodiode unit.

In another embodiment, which may optionally be combined with the above mentioned embodiment, an n-electrode is connected to a plurality of resonator-photodiode units. In other words, a plurality of resonator-photodiode units have a common n-electrode. This n-electrode can e.g. be disposed above the intrinsic regions of the respective resonator-photodiode units, optionally even covering at least a majority of the detector surface. Optionally, a single n-electrode can be connected to all resonator-photodiode units. Alternatively, smaller groups of resonator-photodiode units, e.g. 2-4 units, can be connected to a single n-electrode. In order to prevent the n-electrode from blocking radiation that should be detected, it is preferred that at least that part of the n-electrode that is disposed above the intrinsic regions is transparent for the respective radiation.

Each resonator-photodiode unit is typically at least partially surrounded by at least one dielectric material. These dielectric materials can include a substrate dielectric layer that supports the arrangement of resonator-photodiode units and on which the semiconductor structure is deposited and formed by lithography processes. Furthermore, an embedding dielectric material may be disposed between neighboring resonator-photodiode units, thereby at least partially surrounding these units. I.e. the space between the resonator-photodiode units may at least partially be filled with an embedding dielectric material, which may serve to passivate the semiconductor surfaces, reduce surface currents and/or to stabilize the structure mechanically. A supporting dielectric material, which is not part of the substrate dielectric layer, may be disposed below and/or between the resonator-photodiode units to support them. Also, a covering dielectric material may be disposed on the resonator-photodiode units, thereby at least partially covering the units from above. At least in some embodiments, this may also be referred to as a cover layer or a passivation layer. The refractive index of the at least one surrounding dielectric material is normally smaller than the refractive index of the intrinsic region. Preferentially, low-index dielectrics are used for these at least partially surrounding dielectric materials, that is to say, dielectric materials with a small refractive index, i.e. with small electric permittivity and small magnetic permeability. A typical example for a low-index material for the substrate dielectric layer is silicon dioxide. Material examples for an embedding dielectric and for a dielectric covering of the structure are silicon dioxide or germanium dioxide as well as spin-on polymeric dielectrics. Other examples for standard low-index dielectric materials that can be applied are calcium fluoride and magnesium fluoride. For example, Germanium, having a relative permittivity of 17.2, can be used as a dielectric resonator material in the short-wavelength infrared range together with silicon dioxide, which has a relative permittivity of 2.2, for the embedding medium and the substrate dielectric layer on the support wafer. Large differences in the relative permittivity between the resonator material and the surrounding media may be preferable, since radiation losses are then generally smaller so that most of the electromagnetic power inside the dielectric resonator can be absorbed even when the absorption coefficient is relatively small. The quality factor then is large and the spectral width of the resonance small. However, simulations show that significant improvements with respect to prior art can also be achieved if the difference in relative permittivity is rather small, e.g. if the relative electric permittivity of the surrounding dielectric material is only 20%, 30% or 40% smaller than the relative electric permittivity of the intrinsic region. The refractive index of the surrounding dielectric material may be only 10%, 15% or 20% smaller than that of the intrinsic region.

One embodiment provides that the p-electrodes and the n-electrodes are disposed between the resonator-photodiode units with respect to the detector surface so that every resonator-photodiode unit is disposed adjacent to at least one p-electrode and one n-electrode. This configuration provides for more efficient extraction of free charge carriers from the individual resonator-photodiode units. Groups of resonator-photodiode units may be connected to a single p-electrode and/or a single n-electrode. In order to prevent interference with the photonic function of the resonator-photodiode units and of the two-dimensional arrangement in which the units are arranged, the electrodes could extend downwards along a direction perpendicular to the detector surface.

According to another embodiment, the p-region and the n-region are disposed on opposite sides of the intrinsic region along the detector surface and at a lower end portion of the intrinsic region. The lower end portion is of course an end portion that is facing away from the direction of the radiation to be detected. In this embodiment, the p-region and the n-region may be connected to p-electrodes or n-electrodes, respectively, that extend downwards in a direction perpendicular to the detector surface. These electrodes may then be connected in groups by a p-electrode circuit or n-electrode circuit. This embodiment can be advantageous in that neither the p-regions or n-regions nor the p-electrodes or n-electrodes can interfere with the radiation incident from above the detector surface.

Another embodiment provides that the intrinsic regions are connected in groups to p-regions and n-regions that are disposed alternatingly between the intrinsic regions along a first direction of the detector surface and that extend along a second direction of the detector surface. The first and second direction may be perpendicular to each other. In this embodiment, the p-regions and the n-regions form stripes extending along the second direction, with the intrinsic regions of the individual resonator-photodiode units being disposed in between. Each p-region is connected to a plurality of intrinsic regions along the second direction. Likewise, each n-region is connected to a plurality of intrinsic regions along the second direction. At the interface of an intrinsic region with a p-region and at the interface with a n-region, the space charge regions characteristic for a p-i-n photodiode semiconductor structure with a depletion zone in the intrinsic germanium mesa are formed by charge carrier diffusion. The (relatively small) volumes of the p-region and n-region in the vicinity of the intrinsic region, where the space charge density is not vanishing, can be associated with an individual resonator-photodiode unit. The larger volumetric portions of the p-regions and n-regions, where the space charge density is vanishing, can serve as ohmic conductors made of doped semiconductor material that facilitate the extraction of the photo-generated charge carriers. Towards the edge of the arrangement, each p-region may be connected to a p-electrode and each n-region may be connected to an n-electrode. Alternatively, the respective p-electrode and n-electrode may be connected to the underside of the p-region or n-region, respectively, and extend downwards along a direction perpendicular to the detector surface.

In the above-mentioned embodiment, secondary intrinsic regions can be disposed between the p-regions and n-regions, wherein normally, at least some secondary intrinsic regions extend along the second direction. In other words, in addition to the "normal" p-i-n photodiode semiconductor structures that include a subwavelength dielectric resonator, a further group (e.g. a regular array) of secondary p-i-n photodiode semiconductor structures is formed by the introduction of the additional secondary intrinsic regions between the n- and p-regions. It has been found that additional regions with electric field enhancement may exist within the secondary intrinsic regions. This may lead to an additional photocurrent that can also be extracted by proper configuration of the electrodes. It is understood that the term "secondary" is not to be construed in that the secondary intrinsic region is generally less effective or less important than the intrinsic region of the individual p-i-n photodiode semiconductor structure including a subwavelength dielectric resonator of a unit. At least some of the secondary intrinsic regions may be disposed between neighboring resonator-photodiode units with respect to the second direction. I.e. these secondary intrinsic regions normally extend from one resonator-photodiode unit to the next. Additionally or alternatively, at least some of the secondary intrinsic regions may be disposed between neighboring resonator-photodiode units with respect to the first direction. These secondary intrinsic regions also may extend along the second direction.

According to another embodiment, the p-regions and n-regions are connected in groups via p-electrodes and n-electrodes, respectively, to portions of a p-electrode circuit and portions of an n-electrode circuit that are disposed between the resonator-photodiode units along a first direction of the detector surface and that extend along a second direction of the detector surface. Again, the first and second direction may be perpendicular to each other. The p-electrode circuit electrically connects a plurality of p-electrodes. Some portions of the p-electrode circuit may also be regarded as portions of a p-electrode, or vice versa. Likewise, the n-electrode circuit electrically connects a plurality of n-electrodes and some portions of the n-electrode circuit may also be regarded as portions of a n-electrode, or vice versa. Each of the circuits is adapted for transport of charge carriers that are extracted from the p-i-n photodiode semiconductor structure. In this embodiment, each circuit comprises at least one portion that is disposed between the resonator-photodiode units with respect to the first direction and that extend along the second direction.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
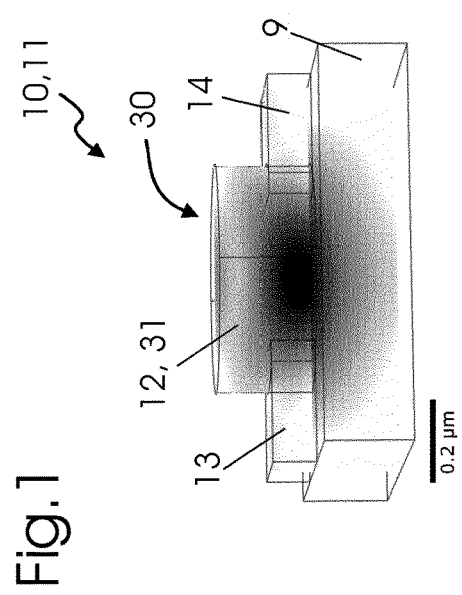
FIG. 1 is a perspective view of a resonator-photodiode unit for an inventive photodetector showing an electric field enhancement factor.

FIG. 1 shows by way of example a resonator-photodiode unit 10 that may be used in an inventive photodetector 1. It comprises a subwavelength dielectric resonator 30 with a cylindrical resonator body 31 made of intrinsic germanium, which also forms the intrinsic region 12 of the structure of a photodiode semiconductor structure 11 of p-i-n type. A p-region 13 and an n-region 14 of the photodiode semiconductor structure 11 are given by germanium ridge pieces that are p- and n-doped, respectively, and that flank the intrinsic region 12 on opposite sides. All three regions 12, 13, 14 are mounted on a substrate dielectric layer 9 having a low refractive index. The resonator 30 and in particular the resonator body 31 (which in the following is also referred to as a "mesa") are dimensioned in such a way that the resonance frequency of the desired resonant response to the external electromagnetic excitation is close to 192 THz, which corresponds to a wavelength of approximately 1.55 μm and a photon energy of 0.8 eV. Moreover, the ratio between the height and the radius of the resonator body 31 is chosen such that the lowest order magnetic and lowest order electric dipole mode do spectrally overlap. This results in a reduction of the backscattering of an incoming electromagnetic wave and in a strong resonant enhancement of the electromagnetic field inside of the resonator body 31.

For the calculations of the response of the array structure to an electromagnetic field excitation periodic boundary conditions were chosen to represent a square lattice array structure of the resonator-photodiode units 10, i.e. this assumes an infinite square lattice array of the units 10 shown in FIG. 1, and the electromagnetic wave excitation was chosen to be a plane wave excitation with normal incidence on the array. The resonant electromagnetic field enhancement as it was obtained by finite-element method calculations is given in FIG. 1 in a grey-scale representation. The resonant enhancement of the electromagnetic field is considerably large with a clear maximum inside of the intrinsic region 12. As the photon energy of the electromagnetic field excitation is larger than the bandgap energy of intrinsic Ge, which was chosen as absorber material in this example, the absorption of photons due to interband transitions accompanied with the generation of free electron-hole pairs is the dominant absorption process. The probability for interband transitions is largest in the locations of largest electromagnetic field intensity.

The calculation results for the resonant electromagnetic field enhancement therefore indicate that the absorption of photons and the generation of free electron-hole pairs occur predominantly inside of the germanium cylinder, i.e. inside of the intrinsic region 12 of the photodiode semiconductor structure 11 of p-i-n type, where the resonant electromagnetic field enhancement is substantial and reaches its maximum value. The numerical calculations yield a value close to 50% for the relative absorption of a resonant electromagnetic wave by the array of resonator-photodiode units 10. The resonant enhancement of the photon absorption inside of the array structure becomes evident by comparison with the absorption in an unstructured layer of material in which no resonant phenomena or interferences occur and which has a thickness equal to the height of the resonator bodies 31 in the array structure. Namely, to achieve the same level of relative absorption of 50%, this unstructured layer of material would need to be made of a material that has a 30-fold larger absorption coefficient than the value of the absorption coefficient for intrinsic germanium used in the numerical simulations.

This example also shows the advantageous aspect of the invention that a semiconductor absorber material can be employed to obtain substantially sensitive photodetector structures although the material's absorption coefficient is too small to be useful for a conventional photodiode. Further finite-element based numerical studies revealed that depending on material parameters even values close to unity for the relative absorption of resonant electromagnetic waves can be achieved for different materials and using similar structures of the resonator-photodiode unit 10.

Figure 2:
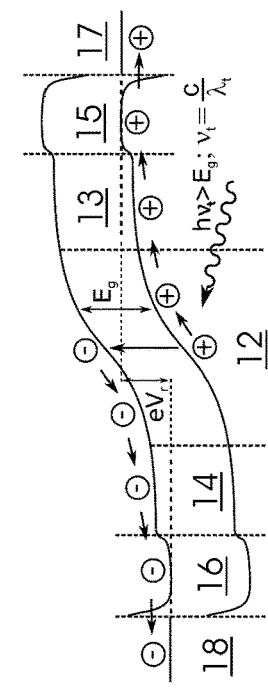
FIG. 2 is an energy band diagram of the resonator-photodiode unit of FIG. 1.
Figure 6:
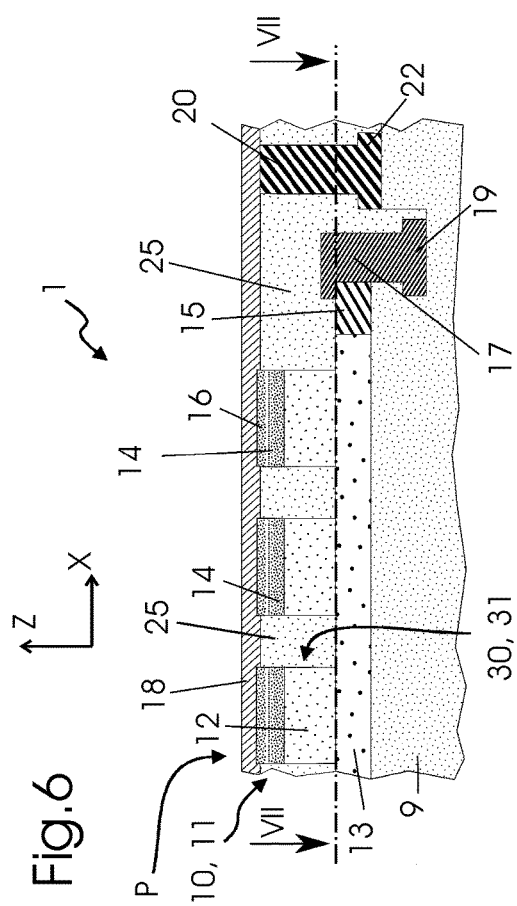
FIG. 6 is a sectional view of a greater portion of the photodetector based on the resonator-photodiode unit as shown in FIG. 5.

FIG. 2 shows an energy band diagram in the example of a p-i-n photodiode semiconductor structure 11 with electronic contacts when a reverse bias voltage $V_r$ is applied. As shown schematically, the p-region 13 connected to a p-electrode 17 made of metal via a p+-region 15 that has an increased dopant concentration. Similarly, the n-region 14 connected to a p-electrode 18 made of metal via an n+-region 16 that has an increased dopant concentration. At the interfaces of the intrinsic region 12 with the p-region 13 and the n-region 14, a negative and a positive space charge region, respectively, is created due to diffusive charge transfer, which leads to a built-in electric field across the depletion zone, which largely corresponds to the intrinsic region 12. The magnitude of the built-in field mainly depends on the dopant concentrations in the p- and n-regions 13, 14 as well as on the width of the intrinsic region 12. The built-in electric field is a static electric field that serves as a drift field for the photo-generated free charge carriers. The drift field for the free charge carriers can be further increased by applying a reverse bias voltage $V_r$. If a photon of a target frequency $v_t$ (which corresponds to a target wavelength $\lambda_t$ of a free-space travelling wave in vacuum) is absorbed that has an energy $hv_t$ greater than a bandgap energy $E_g$ of the absorber material of the photodiode semiconductor structure 11, this leads to the creation of a free electron-hole pair through the interband transition process. The built-in electric field leads to an efficient separation of photo-generated electron-hole pairs in the depletion zone (intrinsic region 12) which can be extracted via the p- and n-regions 13, 14 into the metal electrodes 17, 18. By increasing considerably the dopant concentrations in the p- an n-regions 13, 14 close to the interface with the metal electrodes 17, 18, thus creating the p+- and the n+-region 15, 16, a very narrow depletion width at the semiconductor-metal interfaces is created, such that charge carriers can easily tunnel across and an ohmic type of contact is realized.

Figure 3:
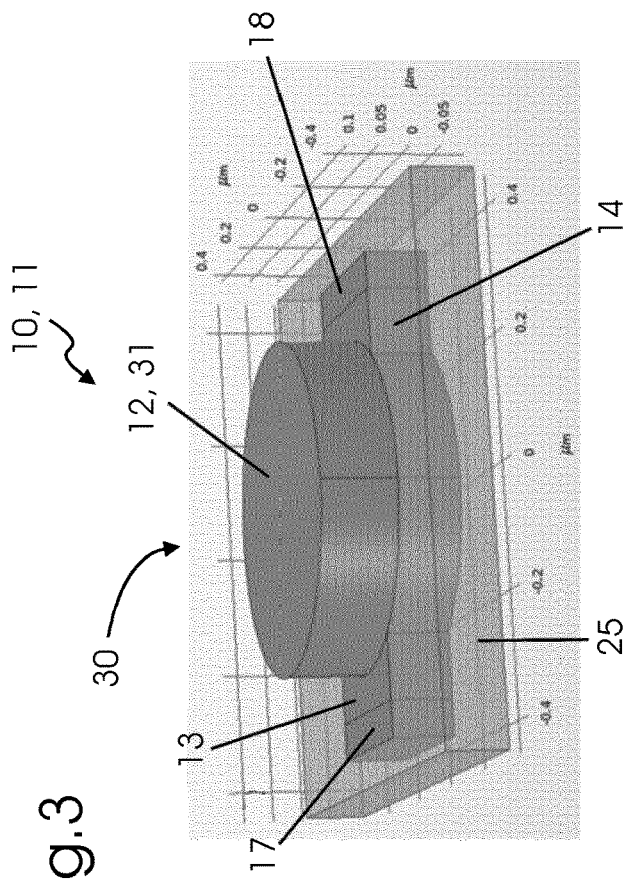
FIG. 3 is a perspective view of another resonator-photodiode unit for an inventive photodetector.
Figure 4:
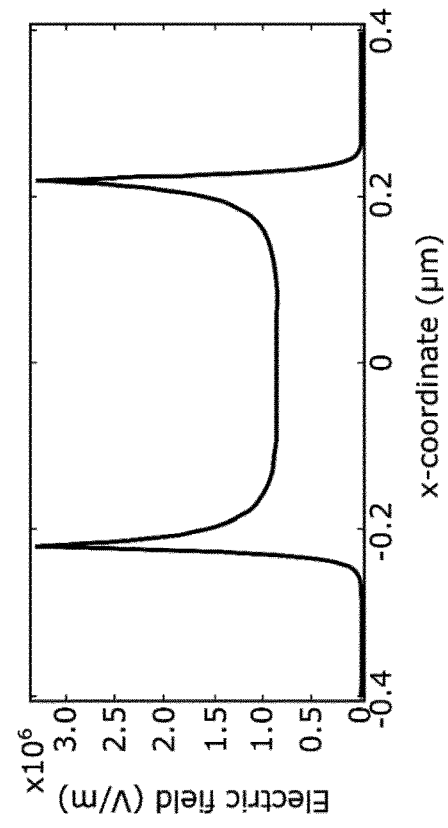
FIG. 4 is a graph showing a built-in electric field strength within the resonator-photodiode unit from FIG. 3.

FIG. 4 illustrates the results of a semiconductor physics simulation based on the finite-element method of a laterally arranged p-i-n resonator-photodiode unit 10 shown FIG. 3. This resonator-photodiode unit 10 largely resembles the one shown in FIG. 1 except for that the lower part of the intrinsic region 12 as well as the p-region 13, n-region 14, p-electrode 17 and n-electrode 18 are enclosed in the substrate dielectric layer 9. FIG. 4 shows the magnitude of the built-in electric field as a function of position in the p-i-n structure without application of a reverse bias voltage. The graph in FIG. 4 shows the built-in electric field along the line crossing the p-i-n structure through the middle points of the two germanium ridge pieces, i.e. the p-region 13 and n-region 14, on opposite sides of the centrally positioned germanium cylinder, i.e. the intrinsic region 12. At moderate doping concentrations of around $10^{17}$ cm$^{-3}$ already a considerably large built-in electric field on the order of $10^6$ V/m arises throughout the entire intrinsic region 12 and is even strongest in the lower part of the cylinder where the resonant field enhancement of the wave excitation is largest (similar to FIG. 1). The advantage of moderate doping concentrations in the p- and n-regions 13, 14 are mainly reduced losses due to free carrier absorption and lower implantation-induced defect densities.

Concerning the choice of semiconductor materials for the resonator-photodiode unit 10, materials with large values for electron and hole mobilities are in principle preferable, because photo-generated free charge carriers can be extracted faster and more efficiently. Similarly, semiconductor materials with small recombination rates for free holes and electrons are in principle preferable. However, due to the small size of the resonator-photodiode unit 10, the photo-generated free charge carriers can be extracted quicker than in the conventional and larger photodiode structures. Hence, carrier mobility and recombination parameters are selection criteria for appropriate semiconductor materials that are at least not as restrictive and important for realizations of the inventive photodetector 1 than for realizations of fast photodiodes known in the art.

Suitable semiconductor materials are preferentially of the crystalline type, since crystalline materials have small concentrations of defects and thereby small concentrations of free charge carriers and of charge trap states, which is favorable for the realization of dielectric resonators 30 and for efficient photo-generation of electron-hole pairs as well as for fast and efficient extraction of these charge carriers to form a photocurrent. Nevertheless, at least some advantages of this invention can also be obtained if polycrystalline or even amorphous semiconductor materials are employed.

For a dielectric body to function as a dielectric resonator 30 or its resonator body 31, the electric permittivity of its constituting material should be substantially larger than the permittivity of the media delimiting the resonator body 31. In the spectral range of interest, the electric permittivity of the intrinsic semiconductor material that forms the subwavelength dielectric resonator 30 should be larger than the permittivity values of dielectric media that surround the dielectric resonators 30, i.e. the substrate dielectric layer 9, the embedding dielectric material 25 and any additional dielectric material used to cover the structure. Germanium, for example, has a relative permittivity of 17.2 and can well be used as a dielectric resonator material in the short-wavelength infrared range with an embedding media and support wafer material like silicon dioxide, for example, which has a relative permittivity of 2.2. Large differences in the relative permittivity between the resonator material and the surrounding media, like in this case, are preferable, since radiation losses are then generally smaller such that most of the electromagnetic power inside the dielectric resonator 30 can be absorbed even when the absorption coefficient is relatively small. The quality factor then is large and the spectral width of the resonance small.

The general approach to design an array of resonator-photodiode units 10 that is sensitive to a desired target wavelength can be based on a stepwise adaptation of the device structure in order to optimize the resonant field enhancement and absorption of the incoming electromagnetic wave in the relevant regions of the semiconductor material as well as to optimize the operationality of the units 10 as photodiodes with a good capability for efficient extraction of photo-generated electron-hole pairs. Due to the high complexity of the interacting system, simulation techniques such as finite-element methods, finite-difference-time-domain methods and/or also T-matrix methods need to be employed to find the optimum dimensions of the resonator 30 (or, more specifically, the of the resonator body 31), the appropriate arrangement of the p-region 13, n-region 14 and electrodes 17, 18, respectively, and the geometric parameters of the arrangement of resonator-photodiode units 10 in the array.

The starting point of a particular design process consists in choosing the right aspect ratio and dimensions of the single subwavelength resonator body 31 such that the lowest order resonant modes are close to the target frequency. The height of the resonator body 31 can for this purpose be approximated by one half of the target wavelength divided by the refractive index of the resonator material. The geometrical parameters of the resonator body 31 are then further tuned until the lowest order magnetic and lowest order electric dipole mode overlap spectrally. Stepwise adaptation of the aspect ratio as well as of the distance between the single resonators 30 will be carried out when the two-dimensional array is formed. An iterative adaptation procedure based on repeated numerical simulations is required here as coupling between the single resonator bodies may lead to more complex collective resonant phenomena. In the case when more complex array realizations are employed, advanced theory concepts of the field of metamaterial or photonic crystal research can be used to adapt the geometry. The iterative adaptation process will be pursued after the implementation of the p-region 13, n-region 14 and electrodes 17, 18 until an optimization of the field enhancement in the intrinsic region 12 is reached. Further semiconductor physics simulations may be added.

Figure 5:
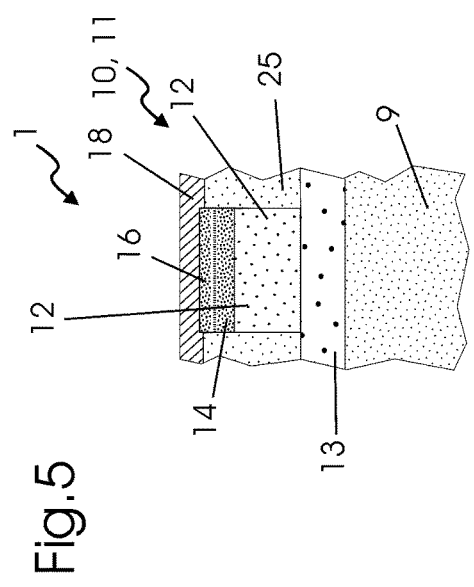
FIG. 5 is a sectional view of a resonator-photodiode unit of a first embodiment of an inventive photodetector.
Figure 7:
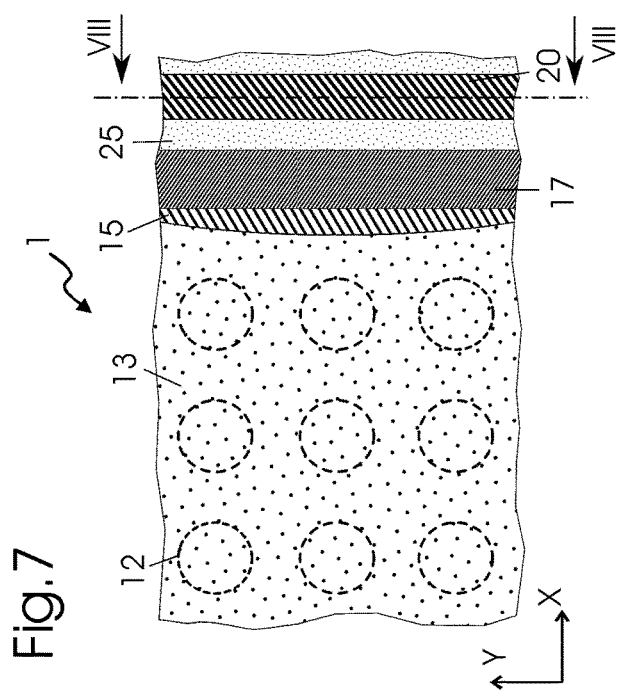
FIG. 7 is a sectional view according to the line VII-VII in FIG. 6.
Figure 11:
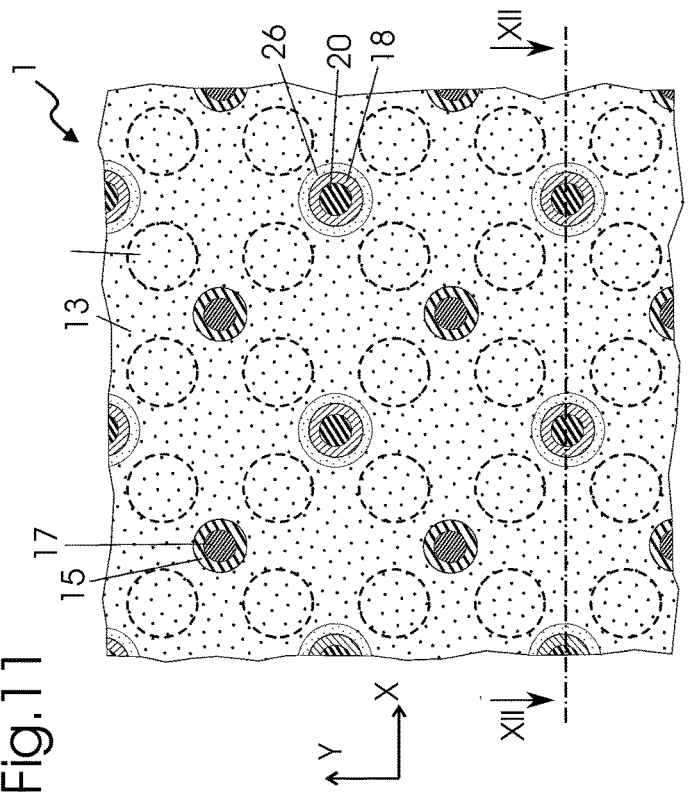
FIG. 11 is a sectional view according to the line XI-XI FIG. 10.

A first embodiment of an inventive photodetector is shown in FIGS. 5-8. It comprises a two-dimensional array of resonator-photodiode units 10, one of which is shown in FIG. 5. As schematically shown in FIG. 5, each single unit 10 comprises a p-i-n photodiode semiconductor structure 11 with an intrinsic region 12 which acts as the resonator body 31 of a dielectric resonator 30 and which is connected to a p-region 13 and n-region 14 at the bottom and top surface, respectively. A symmetry axis of the cylindrical intrinsic region 12 is oriented along a Z-axis, which is perpendicular to an X-axis and a Y-axis that span a detector plane P along which the array of resonator-photodiode units 10 is disposed. The p-i-n semiconductor stack that represents the photodiode semiconductor structure 11 is oriented perpendicular to the detector plane P. The photodetector 1 is most sensitive for electromagnetic radiation incident on the detector plane P vertically from above.

In this embodiment, the resonator-photodiode units 10 are set to form a square lattice array in order to take advantage of the collective effects in the optical response to an electromagnetic wave excitation such that a significantly increased light absorption takes place in the intrinsic regions 12 of the respective units 10. If one considers the target wavelength of 1.55 µm, for example, one can specify that the distance between the centers of neighboring resonator-photodiode units 10 here and in the following embodiments is typically less than 1.4 µm or even less than 1.0 µm. The intrinsic region 12 can be made of intrinsic germanium, which is a suitable semiconductor material for this example with a target wavelength of 1.55 µm. The n-region 14 on top of the intrinsic region 12 forms part of the cylinder and connects—via an n+-region 16—to a thin n-type transparent conductive oxide layer which acts as the n-electrode 18 for the extraction of the photo-generated charges. The n-electrode layer 18 extends over the whole array area to one edge of the array, where it connects via a secondary n-electrode 20 made of metal to the n-electrode circuit 22. The p-region 13 is placed on top of a substrate dielectric layer 9 and forms a continuous layer that connects each single intrinsic region 12 of the two-dimensional array. It extends to the edge of the array, where it is contacted via a p+-region 15 to a p-electrode 17 made of metal, which is connected to the p-electrode circuit 19.

The p-region 13 and the n-region 14 are chosen such that the depletion zone of the p-i-n semiconductor structure lies in the intrinsic region 12 of the dielectric resonator. Moreover, as the p-i-n stack is oriented in the direction of the incoming light, the n-region 14 as well as the n-electrode 18, i.e. the n-type transparent conductive oxide layer, have to be transparent for the incoming radiation such that a maximum of the incoming light is entering the intrinsic region 12. Hence, the bandgap of the n-region 14 must be larger than the energy $h\nu_r$ of the incoming light, i.e. larger than the bandgap $E_g$ of the active intrinsic region 12. In addition, the n-doped semiconductor material is chosen to have a dielectric constant which is significantly smaller than the dielectric constant of the intrinsic region 12 such that the quality factor of the dielectric resonator is maximized due to smaller radiation losses. This ensures the field confinement to be highest in the intrinsic region 12, namely at the location where the electron-hole pair generation preferentially takes place. The same considerations are valid for the p-region 13 which is located below the intrinsic region 12 and which is thus preferentially formed by a p-doped semiconductor of a larger bandgap and smaller dielectric constant. The former requirement is not as strict as in the case of the n-region 14 as the p-region 13 does not have to serve as a window for the incoming light. The resonator-photodiode units 10 are embedded in the embedding dielectric material 25, which is a low index dielectric material, to passivate the structures. In this embodiment, the p-region 13 and the n-region 14 can be made of silicon, which is preferentially doped by boron (B) for the p-type region and with phosphor (P), arsenic (As) or antimony (Sb) for the n-type region. The p-region 13 may alternatively be formed by p-doped germanium. The thickness of the p-region 13 and the n-region 14 depend on the doping level of each region and can be adjusted depending on the material compositions.

In this embodiment, the thickness of the intrinsic germanium region 12 in the cylindrical dielectric resonator 30 is chosen to be in the range of 200 to 250 nm such that the resonance wavelength is located at around 1.5 µm. Semiconductor physics simulation based on finite element method reveals that a at a moderate doping concentration of $10^{16}$ cm$^{-3}$, at which no considerable losses due to free carrier absorption takes place, the space charge region is less than 50 nm wide. In that case, the built-in electric field attains a value of approx. $0.5 \times 10^6$ V/m.

Figure 8:
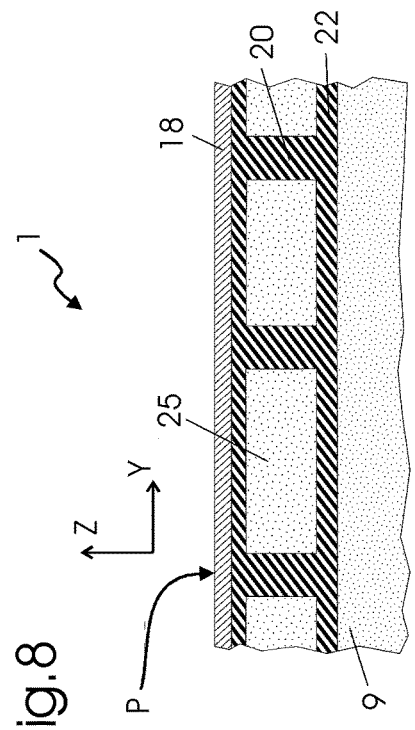
FIG. 8 is a sectional view according to the line VIII-VIII in FIG. 7.

Additionally, a small n+-region 16 of larger n-type doping concentration is formed at the interface between the n-region 14 and the thin n-type transparent conductive oxide layer that constitutes the n-electrode 18. This n+-region 16 may have a doping concentration of up to $10^{19}$ cm$^{-3}$ and ensures an ohmic charge carrier transport over the contact interface with the transparent conductive oxide layer n-electrode 18. The same consideration holds for the p-region 13, where, at the edge of the resonator array, a p+-region 15 is formed at the boundary of the p-region 13 where it connects to the p-electrode 17. The geometrical arrangement of the n-type transparent conductive oxide layer (the n-electrode 18) and the p-region 13 and their respective connection to the metal electrodes 17, 20 is visualized in FIGS. 7 and 8. The metal electrodes 17, 20, which may consist of standard metal electrode materials as defined earlier, are embedded in the embedding dielectric material 25 and in larger depth in the substrate dielectric layer 9 and are prolonged to a certain depth below the level of the array of subwavelength resonators where they connect to a p- and n-electrode circuit 19, 22, respectively. FIG. 8 schematically shows a cross-section view of the arrangement of the connections of the metal electrode 20 to the n-electrode circuit 22. In the present example, the n-electrodes 20 connect to the n-electrode circuit 22 in different nodes that are arranged in parallel. However, other connection schemes are also possible.

For the fabrication of the photodetector 1 shown in FIGS. 5-8, one can make use of an epitaxy wafer with the layer structure of e.g. n-silicon-germanium-p-silicon on a silicon dioxide layer and with the desired thicknesses. The p- and n-type doping can be introduced during the epitaxial growth of the layers by e.g. ion implantation process. The cylindrical mesa including the intrinsic germanium region 12 and the n-region 14 (n-doped silicon region) can be formed by etching the surrounding parts using electron-beam lithography or photolithography. Additional etching of the p-region 13 (p-doped silicon layer) at the edge of the array is followed by subsequent ion implantation at the border of the p-region 13 to form the p+-region 15. Trenches for the buried metal p- and n-electrode circuit 19, 22 can be etched into the substrate dielectric layer 9 using electron-beam lithography or photolithography. The buried metal electrode lines can be deposited in the trenches formed in the silicon dioxide layer to form the p- and n-electrode circuits 19, 22. Further deposition of metal electrode material enables the connection to the p+-region 15 and the formation of the metal n-electrode 20 that will connect the n-type transparent conductive oxide electrode 18.

The remaining trenches in the substrate dielectric layer (silicon dioxide layer) 9 as well as the volume between the cylindrical mesas can be filled with embedding dielectric material 25 up to the level where the n-regions 14 end. Examples for materials that may be used as embedding dielectric material 25 are silicon dioxide, germanium dioxide, magnesium fluoride, calcium fluoride and spin-on polymeric dielectrics. Finally, a thin n-type transparent conductive oxide layer can be deposited on top of the structure to make the connection between the n+-regions 16 of the cylindrical mesa via the metal electrode 20 to the n-electrode circuit 22. At the end of the fabrication process, a passivation layer composed of a low index dielectric, for example, silicon dioxide, silicon nitride, germanium dioxide ($GeO_2$) or a polymer may be deposited on top of the structure. In this embodiment and also generally in other embodiments of the invention, the passivation layer as well as the embedding dielectric material 25 may also serve to suppress surface leakage currents which may appear due to large defect densities on the surface of the intrinsic region of the p-i-n photodiode semiconductor structure 11 that may result from nano-structuring processes. An appropriate passivation layer can reduce the interface state density and lead to a considerable reduction of surface leakage currents. In the case of germanium as intrinsic layer in the photodiode semiconductor structure 11, germanium dioxide may be used as embedding or passivation medium in case that significant surface leakage currents appear, as it can minimize the density of crystal defect in the interface region between the germanium and germanium dioxide, resulting in a high interface crystal quality. It is also possible to first deposit an appropriate crystalline passivation layer for this purpose, like germanium dioxide in this example, and then in a second step, apply a different dielectric material, for example a spin-on polymeric dielectric, for the embedding dielectric material. Considerable crystal defect densities at the interface with the p- or n-doped region may additionally be provoked by the ion implantation process of the p-and n-type doping. In that case, an alternative doping process such as, e.g. the gas-phase doping process, which leads to a lower diffusion of the dopant and thus results in p- and n-doped regions with low defect densities, could be employed.

Figure 12:
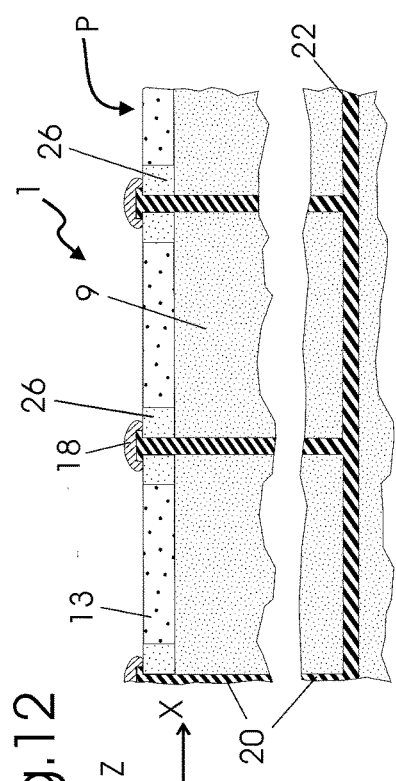
FIG. 12 is a sectional view according to the line XII-XII in FIG. 11.
Figure 9:
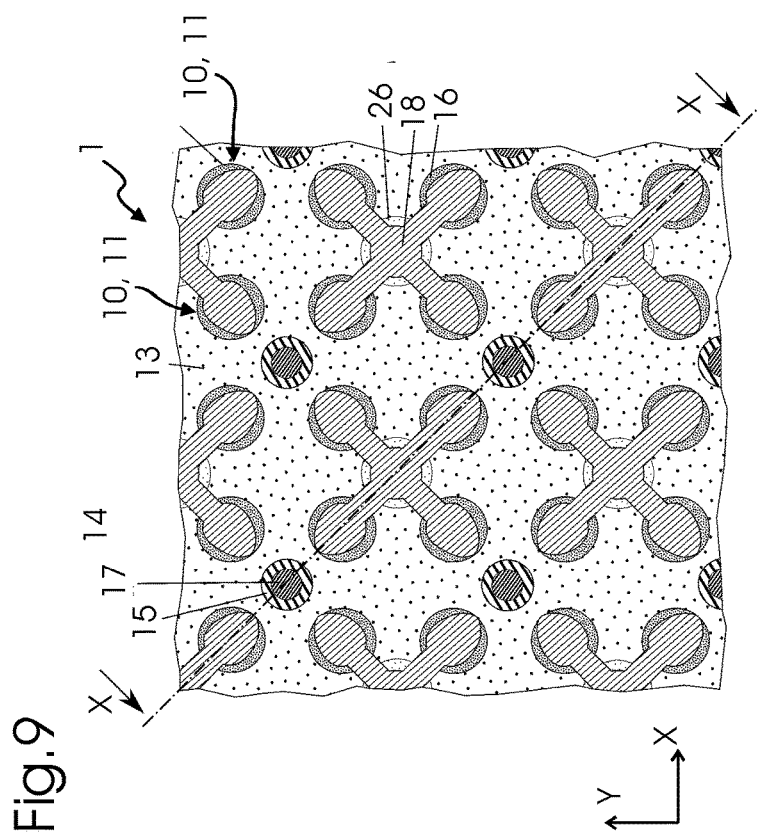
FIG. 9 is a top view of a second embodiment of an inventive photodetector.
Figure 10:
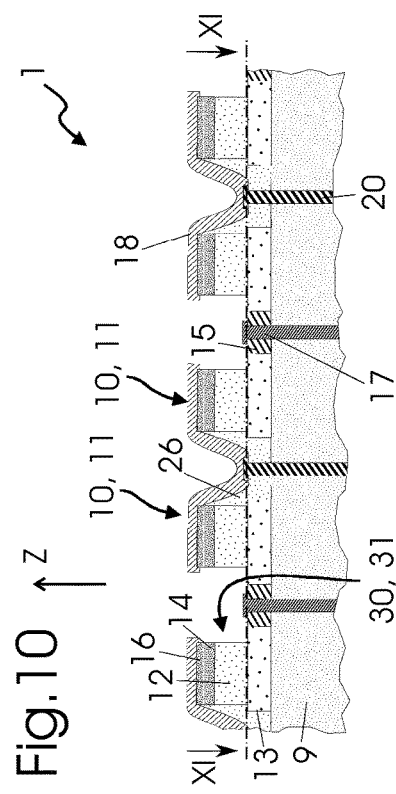
FIG. 10 is a sectional view according to the line X-X in FIG. 9.
Figure 13:
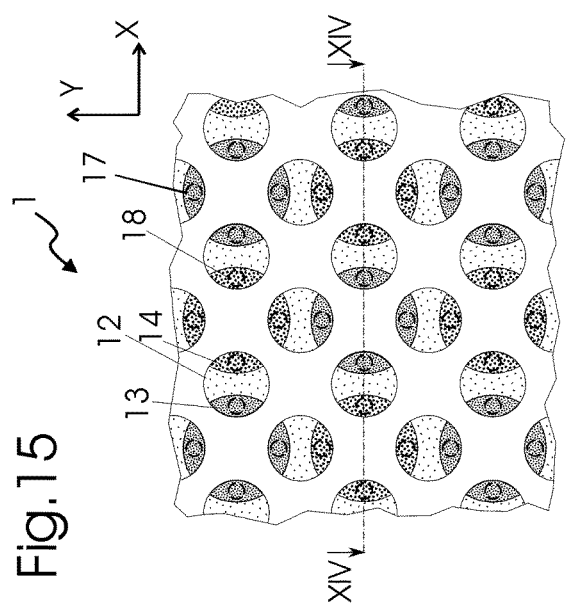
FIG. 13 is a top view of a third embodiment of an inventive photodetector.
Figure 15:
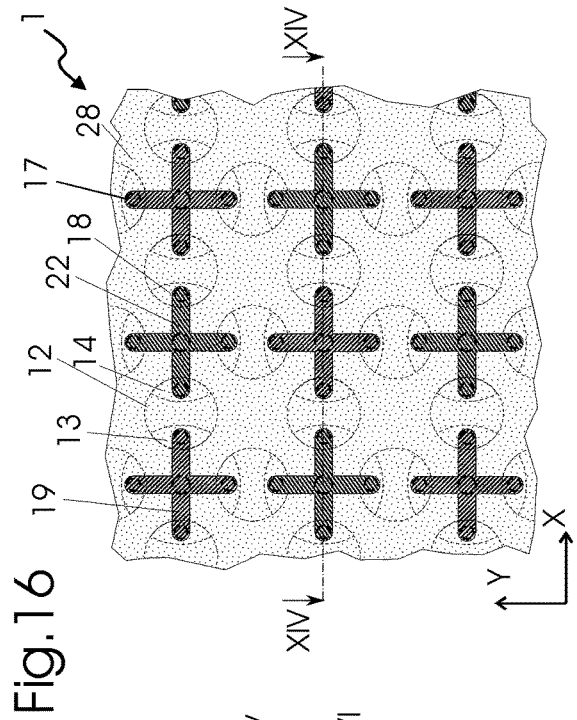
FIG. 15 is a sectional view according to the line XV-XV in FIG. 14.
Figure 14:
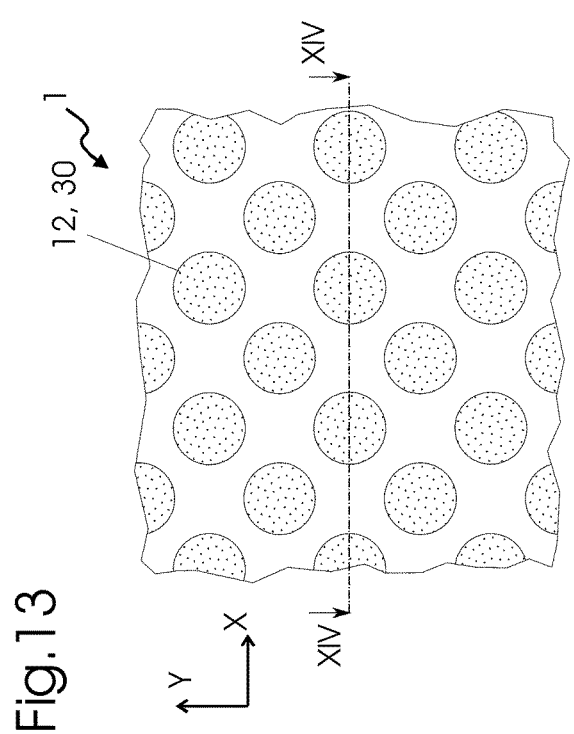
FIG. 14 is a sectional view according to the line XIV-XIV in FIG. 13.
Figure 16:
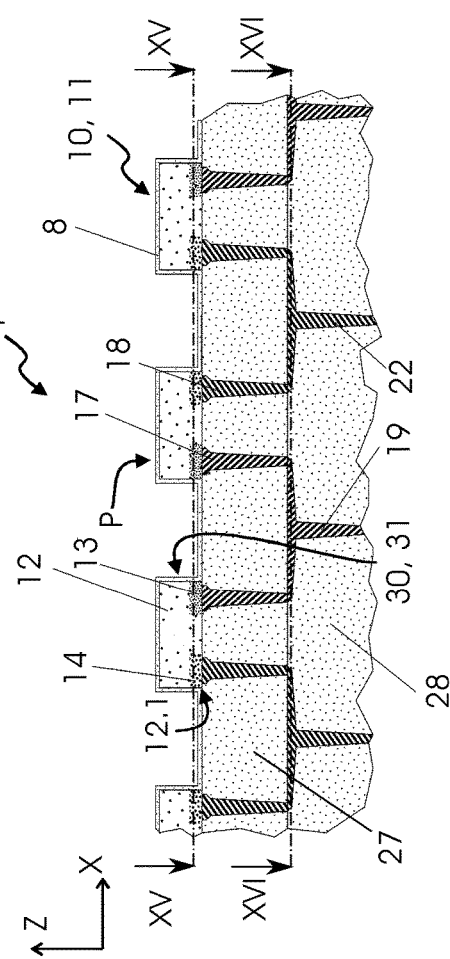
FIG. 16 is a sectional view according to the line XVI-XVI in FIG. 14.

FIGS. 9-12 show a second embodiment of an inventive photodetector 1. Like the first embodiment, it comprises a two-dimensional array of resonator-photodiode units 10, each of which comprises a photodiode semiconductor structure 11 with an intrinsic germanium region 12 and a lower p-region 13 and upper n-region 14 (a p- and n-doped silicon region), respectively, forming a vertical p-i-n semiconductor layer stack. In contrast to the former example, in which the resonator-photodiode units 10 in the array are mutually connected to a common n-electrode via a n-type transparent conducting oxide layer, the electrodes 17, 18, 20 are disposed between the resonator-photodiode units 10 so that each resonator-photodiode unit 10 is adjacent to and has a direct connection to a p-electrode 17 and the p-electrode circuit 19, as well as to an n-electrode 18 realized as a transparent n-type conductive oxide that is in contact with the metallic secondary n-electrode 20. This setup may increase the fabrication complexity of the photodetector 1, however, also increases the extraction speed of the photo-generated charge carriers from each p-i-n photodiode semiconductor structure 11. A thin n-type transparent conductive oxide layer as an n-electrode 18 connects the n-regions 14 of a total of four resonator-photodiode units 10 via their n+-doped surface which forms an n+-region 16. In the center of each of these quadruples of interconnected units, the transparent conductive layer of the n-electrode 18 is stretched down such that it connects to a secondary n-electrode 20 made of metal that is integrated in a substrate dielectric layer 9 and is prolonged downwards along the Z-axis to a certain depth. A p-doped semiconductor layer extends over the area of the entire array of resonator-photodiode units and forms at each unit the p-region 13 of the pin photodiode semiconductor structure 11. The p-doped semiconductor layer is perforated by two regular arrays of holes. A first array of holes consists of smaller holes, that are each located centrally of four of the quadruples of units interconnected by the transparent n-type conducting oxide n-electrode 18. The holes of this first type are prolongated down into the substrate dielectric layer 9 to a certain depth and accommodate the metallic p-electrodes 17. In the p-doped semiconductor layer, the border region of the holes of the first type is p-doped with a larger dopant concentration to form p+-regions 15 that ensure ohmic contacts with the metal p-electrodes 17. A second array of holes consists of larger holes in the p-doped semiconductor layer that are each located in the center of the quadruples of units interconnected by the transparent n-type conductive oxide n-electrode 18. The holes of this second type are also prolongated down into the substrate dielectric layer 9 to a certain depth, but the diameter of the hole prolongations in the substrate dielectric layer 9 is smaller than the diameter of the holes of second type in the p-doped semiconductor layer. The holes of the second type accommodate the metallic secondary n-electrode 20. The conductive oxide n-electrodes 18 and the metallic secondary n-electrodes 20 are electrically insulated from the p-doped semiconductor layer and the surface of the intrinsic region 12 of the resonator-photodiode units 10 by a low index first supporting dielectric material 26 that is deposited into the holes of second type in the p-doped semiconductor layer, leaving a smaller opening for the secondary n-electrode 20, and reaching up and covering the part of the surface of the intrinsic region 12 of the resonator-photodiode units 10 that may otherwise come into contact with the n-electrode 18. Obviously, to deposit the buried metallic electrode circuits 19, 22 trenches need to be etched into the p-doped semiconductor layer and into the substrate dielectric layer 9. After deposition of the metal for the electrode circuits 19, 22, the remaining respective trenches in the substrate dielectric layer 9 and in the p-doped semiconductor layer can be filled up with silicon dioxide or another low index dielectric material up to the level of the p-doped semiconductor layer and from that level on with p-doped silicon. The arrangement of the metal electrodes 17, 20 is such that the p-region 13 and the n-region 14 of each single resonator-photodiode unit 10 have a direct connection enabling a faster charge carrier extraction after electron-hole pair creation. In other words, the p-electrodes 17 and the n-electrodes 18, 20 are disposed between the resonator-photodiode units 10 with respect to the detector plane P so that every resonator-photodiode unit 10 is disposed adjacent to at least one p-electrode 17 and one n-electrode 18, 20. Over the uncovered surface areas of the intrinsic region 12 and the p-region 13 of the resonator-photodiode units 10, of the p-doped semiconductor layer and of the p-electrodes 17, a passivation layer can then be deposited. As can be seen in FIG. 12, a plurality of secondary n-electrodes 20 are connected to a n-electrode circuit 22. Similarly, the p-electrodes 17 are connected to a p-electrode circuit 19 (not shown in the figures). As shown in FIG. 12, a line of the n-electrode circuit 22 makes parallel connections with all secondary n-electrodes 20 on that line. In the same way, a line of the p-electrode circuit 19 makes parallel connections with all p-electrodes 17 on that line. Multiples of these lines of the n-electrode circuit 22 and of the p-electrode circuit 19, respectively, can be extended to the edge of the array, where by a further set of parallel connections (not shown in the figures) all p-electrodes 17 and all n-electrodes 18, 20, respectively, of the array are interconnected to form a common p-terminal and a common n-terminal, respectively, of the photodetector 1.

For a possible fabrication of this embodiment of the photodetector 1, one can again make use of an epitaxy wafer with the layer structure of e.g. n-silicon-germanium-p-silicon on a silicon dioxide layer. The cylindrical mesa or resonator body 31 including the intrinsic germanium and n-doped silicon regions can be obtained by etching the surrounding parts using electron-beam lithography or photolithography. Then by further lithographic structuring processes the two regular arrays of holes of the first and the second type as described above can be etched into the p-doped silicon layer as well as their prolongations into the silicon dioxide layer that forms substrate dielectric layer 9 here. The same processing can also be used to define the trenches in the p-doped silicon layer and in the underlying silicon dioxide layer for the buried metallic p- and n-electrode circuits 19 and 22, respectively. The p+-regions 15 at the border of the holes of the first type in the p-doped silicon layer can be realized using ion implantation. Metallic electrode material can then be deposited to form the buried p- and n-electrode circuits 19 and 22, and to generate the metallic p-electrodes 17 as well as the metallic secondary n-electrodes 20, to which the transparent n-type conductive oxide n-electrodes 18 can connect when they are deposited. After the deposition of the metal electrode material, the remaining trenches in the silicon dioxide layer can be filled with silicon dioxide and the remaining trenches in the p-doped silicon layer can be closed with p-doped silicon with the exception of the holes of second type, which require the deposition of silicon dioxide or another low index dielectric material to insulate the secondary n-electrodes 20 from the p-doped silicon layer. Before the thin transparent n-type conductive oxide layer is deposited to form the n-electrodes 18 that connect each of the quadruples of resonator-photodiode units 10 to the n-electrode circuit 22 via a secondary n-electrode 20, a low index first supporting dielectric material 26 has to be deposited that ensures the electrical insulation between the conductive oxide layer forming the n-electrodes 18 and the mesa mantle surface including the p-, n-, and intrinsic region 13, 14, and 12 as well as exposed surfaces of the p-doped silicon layer. Finally, the thin n-type conductive oxide layer can be deposited. Optionally, a passivation layer may be deposited over the structure to protect the n-type transparent conductive oxide layer, the p-doped silicon layer and the exposed surfaces of the metal electrodes.

FIGS. 13-16 show a third embodiment of an inventive photodetector 1. The resonator bodies 31 of the subwavelength dielectric resonators 30 are chosen to be of cylindrical shape and are also chosen to be arranged in a regular rectangular or square array. In this embodiment, the photodiode semiconductor structures 11 are made of germanium. The cylindrical intrinsic region 12 is made essentially of intrinsic germanium which has at its lower end portion 12.1 on opposite sides an (n-doped) n-region 14 and a (p-doped) p-region 13. Additionally, at the very bottom of the cylinder, the n- and p-regions 13, 14 of the cylinder contain narrow n+- and p+-regions (not shown in the figures), which have larger dopant concentrations such that ohmic contacts with metal electrodes 17, 18 can be realized. The metal electrodes 17, 18 are embedded in a first layer of a low index second supporting dielectric material 27 and are prolonged to a certain depth under the array of subwavelength resonators 30 where they are connected to the p- and n-electrode circuits 19, 22, which are also embedded in a second layer of a low index third supporting dielectric material 28. Here and in the following, each of the first, second and third supporting dielectric material 26, 27, 28 may be different or at least two of these materials may be identical. In this embodiment, the p- and n-electrode circuits 19, 22 are configured in nodes that connect in parallel the n-electrodes 18 of four neighboring resonator-photodiode units 10 in each node as well as to connect in parallel the p-electrodes 17 of four neighboring resonator-photodiode units 10 in other nodes. Further parts of the electrode circuits 19, 22 are not schematically shown in the figures. The nodes of parallel connections of p-electrodes 17 can conveniently be further connected together by additional parallel electrode circuit lines running under the nodes diagonally in the cross-section view of FIG. 16. Similarly, the nodes of parallel connections of n-electrodes 18 can be connected together by additional n-electrode circuit lines beneath the nodes. These parallel electrode circuit lines of p- and n-electrode type can in turn be connected together in parallel for each electrode type to obtain a single p-electrode connection terminal and a single n-electrode connection terminal for the photodetector 1.

To fabricate the array of subwavelength dielectric resonator and photodiode units, variants of an epitaxial lift-off procedure, for example, as described in U.S. Pat. No. 4,883,561 A, US 2015/0279741 A1, US 2017/069491 A1 or in Camacho-Morales et al. *Nano Lett.* 16, 7191-7197 (2016) can be used. In this embodiment using germanium as semiconductor, the epitaxial growth of a germanium crystal layer on silicon dioxide can be achieved under low to moderate growth temperature and low growth pressure conditions. Subsequent annealing at higher temperatures and temperature cycling can improve the quality of grown germanium layers. The silicon dioxide substrate can, for example, be formed by a silicon dioxide layer on a silicon wafer. In this case the silicon dioxide layer on which the germanium layer is grown can function as a sacrificial release layer for an epitaxial lift-off procedure. In order to form p- and n-regions 13, 14 in the germanium layer as needed for the realization of the p-i-n photodiode semiconductor structures as well as the p+-regions and n+-regions needed to form ohmic contacts for the electrodes, the epitaxial germanium growth process can be interrupted and ion implantation can be used to realize the desired semiconductor doping profiles in the germanium layer.

Subsequently, the epitaxial growth of germanium can resume with the deposition of intrinsic germanium. Electron-beam lithography or photolithography can be employed to define the cylindrical mesas in the germanium layer that will form the resonator bodies 31. In an epitaxial lift-off procedure the array of germanium mesas can be embedded and fixed in a polymer layer, for example, in poly(methyl methacrylate) (PMMA), that can be attached to a handle wafer, and the silicon dioxide layer under the germanium mesas can be etched away. The base of the mesas in the array being exposed at that stage, metal can then be deposited for the n- and p-electrodes 17, 18 at the designated locations, where also n+ and p+ doping is provided to form ohmic contacts with the electrodes 17, 18. The volume between the electrodes 17, 18 is filled with a low index second supporting dielectric material 27, for example, silicon oxide, silicon nitride or a spin-on polymeric dielectric. Then, very similar to typical back-end-of-line processing in semiconductor device fabrication, further parts of the p- and n-electrode circuits 19, 22 embedded in the third supporting dielectric material 28 can be realized including possibly bonding pads or solder bump contacts. Finally, the array structure of units 10 including the electrode circuits 19, 22 can be released from the handle wafer by dissolving the PMMA, and an additional passivation layer, for example, silicon dioxide or also PMMA is deposited over the mesas. Alternatively, a passivation layer can be deposited over the germanium mesas at an earlier stage after the lithographic processing of the germanium layer and before the epitaxial lift-off procedure.

Figure 18:
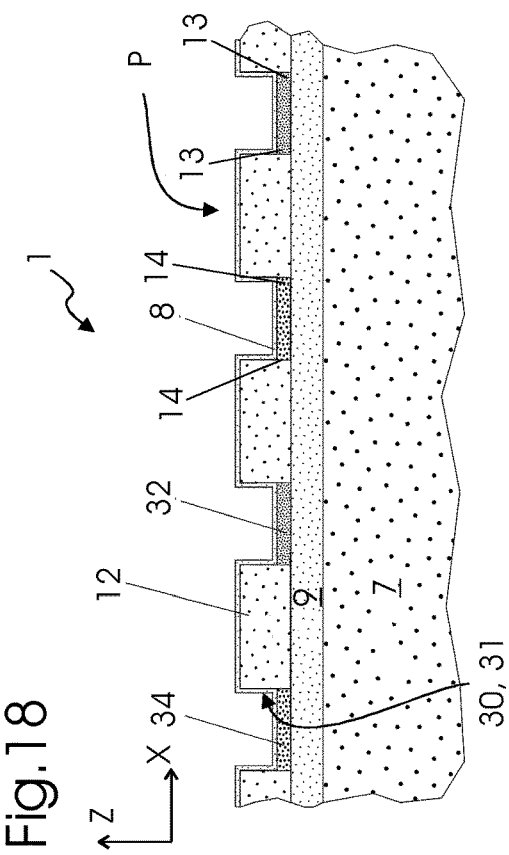
FIG. 18 is a sectional view according to the line XVIII-XVIII in FIG. 17.
Figure 17:
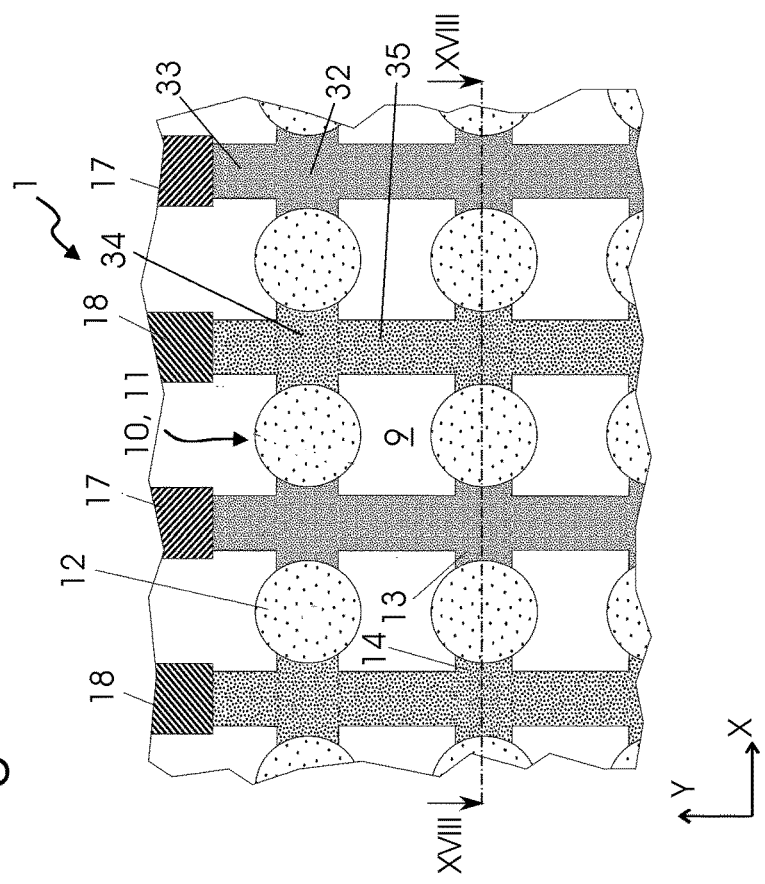
FIG. 17 is a top view of a fourth embodiment of an inventive photodetector.

A further embodiment of an inventive photodetector 1, in which a lateral p-i-n photodiode semiconductor structure is realized for each resonator-photodiode unit 10 in the array is schematically shown in FIGS. 17 and 18. Again, a cylindrical geometry can be chosen for the subwavelength dielectric resonators 30 and for simplicity also intrinsic germanium can be chosen for the dielectric material. The array arrangement of the units can be chosen to form a regular rectangular or square lattice. The cylindrical resonator body 31 or cylindrical germanium mesa forms the entire intrinsic region 12 of the p-i-n photodiode semiconductor structure 11 of the individual resonator-photodiode unit 10. In a first direction (along the X-axis) of the rectangular array, every cylindrical germanium mesa (intrinsic region 12) in the array is connected via a p-doped germanium ridge 32 of smaller height than the mesa's height and of smaller width than the mesa's diameter to the neighboring mesa on one side, and connected by a similar n-doped germanium ridge 34 to the neighboring mesa on the opposite side. At the interface of a mesa with a p-doped ridge 32 and at the interface with a n-doped ridge 34 the space charge regions characteristic for a p-i-n photodiode semiconductor structure 11 with a depletion zone in the intrinsic germanium mesa are formed by charge carrier diffusion. The ridges 32, 34 can be regarded as comprising the p-region 13 and the n-region 14, respectively, or they may be regarded as identical with the p-regions 13 and the n-regions 14. In relatively small volumes of the p-doped, respectively n-doped germanium ridge 32, 34, in the vicinity of the mesa, the space charge density is not vanishing. Here, the p-region 13 and the n-region 14, respectively, define the p-i and n-i junctions of an individual resonator-photodiode unit 11. The larger volumetric portions of the p- and n-doped germanium ridges 32, 34, where the space charge density is vanishing, serve as ohmic conductors made of doped semiconductor material that facilitate the extraction of the photo-generated charge carriers. Thus, along the first direction in the array the photodiode semiconductor structures 11 are alternating from p-i-n to n-i-p and back when moving from one mesa to the next. The semiconductor structure including the intrinsic germanium mesas 12 and the n- and p-doped germanium ridges 32, 34 forming the array of p-i-n photodiode semiconductor structures 11 are disposed on a substrate dielectric layer 9 that in this example can consist of a silicon dioxide layer on a silicon wafer 7 that in turn serves as substrate or carrier of the structure of the photodetector 1.

In a second direction (along the Y-axis) of the array that is orthogonal to the first direction, the n-doped germanium ridges 34 connecting the mesas are connected in their middle by similar n-doped germanium ridges 35 running along the second direction, and the p-doped germanium ridges 32 connecting neighboring mesas in the first direction are connected by p-doped ridges 33 running along the second direction. These p- and n-doped ridges mainly serve as resistive conductors made of doped semiconductor material over which the extraction of the photogenerated charge carriers from the p-i-n photodiode semiconductor structures 11 is achieved. At the border of the array in the second direction, the n- and p-doped ridges running along the second direction can be prolongated over a distance allowing for the realization of electrode contacts. For this purpose, the prolongated sections of the n- and p-doped ridges running along the second direction can be doped with larger concentrations of donor and acceptor atoms, respectively, to form n+-regions and p+-regions (not shown in the figures) that facilitate the realization of ohmic contacts with metal electrodes 17, 18. The p-electrodes 17 and n-electrodes 18 thus formed can then be connected in parallel by p-electrode and n-electrode circuits, respectively.

For the fabrication of this embodiment, an intrinsic germanium on silicon dioxide epitaxy wafer can be used. The cylindrical intrinsic germanium mesas and the germanium ridges that run along the first direction of the array and connect the germanium mesas as well as the germanium ridges that run along the second direction of the array can be formed by electron-beam lithography or photolithography applied to the intrinsic germanium layer. Subsequent ion implantation can be used to realize p- and n-doping of the germanium ridge regions that run between the mesas along the first and second direction of the array. The p+- and n+-regions of the prolonged ridges running along the second array direction at the border of the array can be obtained by additional ion implantation stages. Then metal electrodes 17, 18 and dielectric layers can be deposited in the border regions of the array to form the ohmic electrode contacts to the p+- and n+-regions of the germanium ridges and to realize the p- and n-electrode circuits. Finally, a passivation layer 8 composed of a dielectric, for example, silicon dioxide, germanium dioxide, silicon nitride or a polymer can be deposited over the structure.

Figure 20:
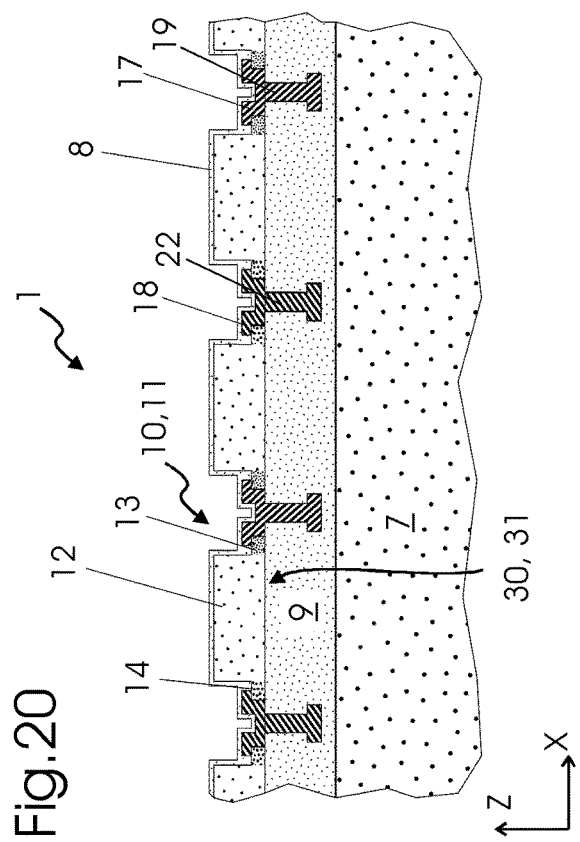
FIG. 20 is a sectional view according to the line XX-XX in FIG. 19.
Figure 19:
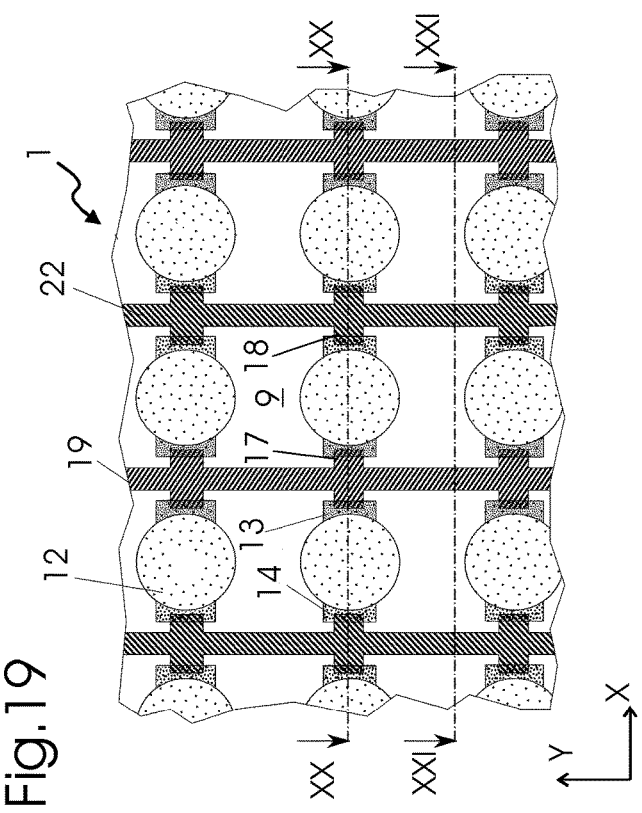
FIG. 19 is a top view of a fifth embodiment of an inventive photodetector.
Figure 21:
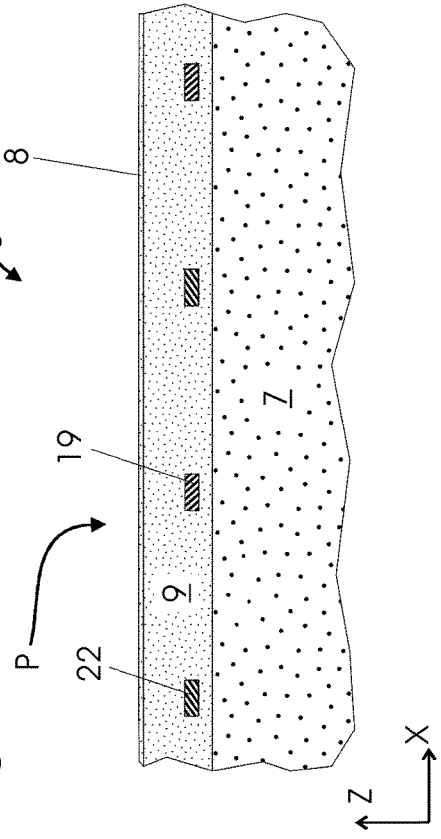
FIG. 21 is a sectional view according to the line XXI-XXI in FIG. 19.
Figure 23:
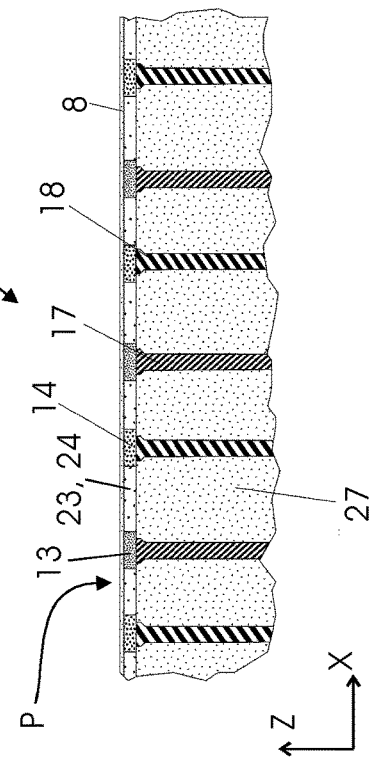
FIG. 23 is a sectional view according to the line XXIII-XXIII in FIG. 22.

FIGS. 19-21 show another embodiment of an inventive photodetector 1, in which a lateral p-i-n semiconductor structure is realized in each resonator-photodiode unit 10. For sake of simplicity, an arrangement of the units 10 in the array is chosen to form a rectangular lattice. A cylindrical geometry is chosen for the subwavelength dielectric resonator 30—i.e. its resonator body 31—of each unit 10 and the dielectric material of the resonator 30 can be chosen to be germanium, for example. Germanium can also be used to form the semiconductor p-i-n photodiode semiconductor structure 11 in each unit 10. The intrinsic germanium cylindrical mesa being the intrinsic region 12 of the p-i-n structure the p- and n-doped regions 13, 14 of the photodiode semiconductor structure 11 are formed by two germanium ridge pieces that protrude from each germanium mesa on opposite sites and along a first direction (along the X-axis) of the rectangular array. The germanium ridge pieces can have considerably smaller height than the germanium mesas and can also have a smaller width than a mesa's diameter. The ridge pieces of germanium are p- and n-doped such that each mesa is attached to a p-doped ridge piece (forming a p-region 13) and to an n-doped ridge piece (forming a n-region 14) and the semiconductor structure alternates from p-i-n to n-i-p and back along a line of units 10 in the first direction of the rectangular array. Again, the photodiode semiconductor structures 11 of each resonator-photodiode unit 10 are disposed on a substrate dielectric layer 9, which is a layer of silicon dioxide. This substrate dielectric layer 9 in turn is disposed on a silicon wafer 7, which functions as a substrate or carrier of the structure of the photodetector 1.

The edge region of the p-doped germanium ridge pieces can be p+-doped to enable ohmic electrode contacts, and similarly the n-doped germanium ridge pieces can contain an n+-doped edge region with the same purpose. In this embodiment each unit in the array is contacted with metal electrodes on the p- and n-side of the p-i-n photodiode semiconductor structure. In order to prevent disturbing effects of metal electrodes 17, 18 and electrode circuits 19, 22 on the interaction of the electromagnetic wave with the array structure of subwavelength resonators, the p- and n-electrode circuits 19, 22 to which each unit is connected can be buried in the silicon dioxide layer at a certain level below the level of the array of subwavelength resonators. Only at the points where two units are connected to the p- or n-electrode 17, 18, the metal layer of the otherwise buried p- or n-electrode electrode circuit 19, 22 reaches the level of the resonator array. As schematically shown in FIG. 19, the buried p- and n-electrode circuits 19, 22 run between the units along a second direction (along the Y-axis) of the rectangular array that is orthogonal to the first direction. At the border of the array the buried p- and n-electrode circuits 19, 22 can be connected in parallel to form a single p-electrode contact and a single n-electrode contact for the array.

For the fabrication of an array structure of subwavelength resonators 30 and photodiode semiconductor structures 11, as just described, an intrinsic germanium on silicon dioxide epitaxy wafer can be used. The mesas with the protruding ridge pieces can be obtained by applying electron-beam lithography or photolithography to intrinsic germanium layer. Using ion implantation, the n- and p-doping of the ridge pieces can be realized and similarly an n+ or p+ doping of the edge region of the n-doped or p-doped ridge pieces can be achieved. Trenches for the buried metal p- and n-electrode circuits 19, 22 can be etched into the silicon dioxide layer that forms the substrate dielectric layer 9 using electron-beam lithography or photolithography. The buried metal electrode lines can be deposited in the trenches formed in the substrate dielectric layer 9. At the points close to where the photodiode semiconductor structures 11 will be contacted, the thicker layer of metal is deposited to reach a level at which the metal electrodes 17, 18 on the p-doped, respectively n-doped germanium ridge pieces can be realized and their connection to the respective buried electrode circuit 19, 22 can be achieved. The trenches in the silicon dioxide can be filled above the deposited metal electrode circuits with silicon dioxide or another low index dielectric. In further metal and dielectric deposition stages the p- and n-electrode circuits 19, 22 can be completed at the border of the array with parallel connections (not shown in the figures) to form a single p- and a single n-electrode contact for the array. Finally, a passivation layer 8 composed of a dielectric, for example, silicon dioxide, germanium dioxide, silicon nitride or a polymer can be deposited over the array structure including the germanium mesas, the p- and n-doped germanium ridge pieces with the exposed surface area of the electrodes 17, 18.

Figure 26:
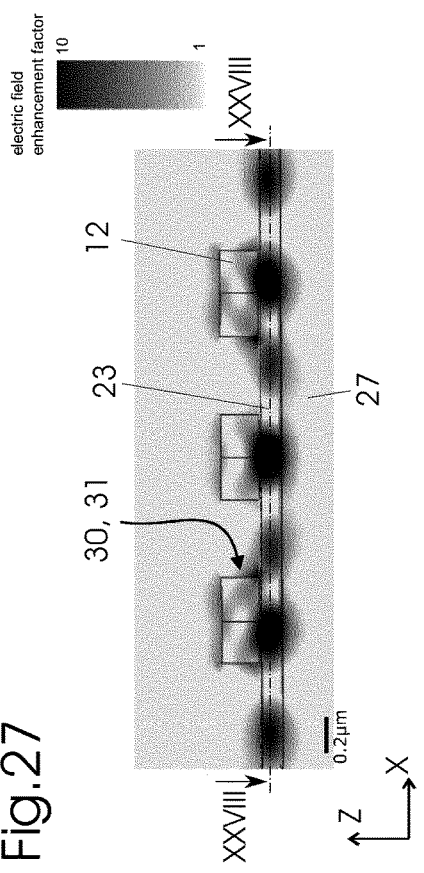
FIG. 26 is a sectional view according to the line XXVI-XXVI in FIG. 25.
Figure 27:
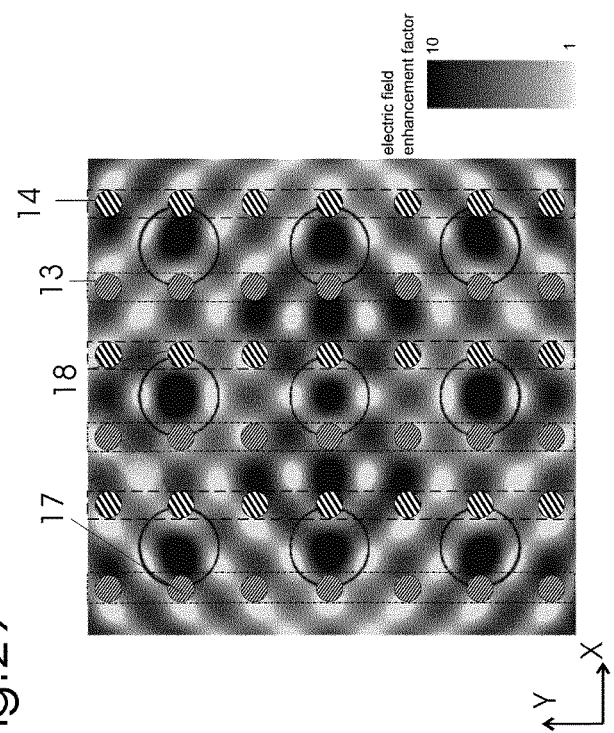
FIG. 27 is a sectional diagram corresponding to FIG. 24 showing the electric field enhancement factor in greyscale representation.
Figure 28:
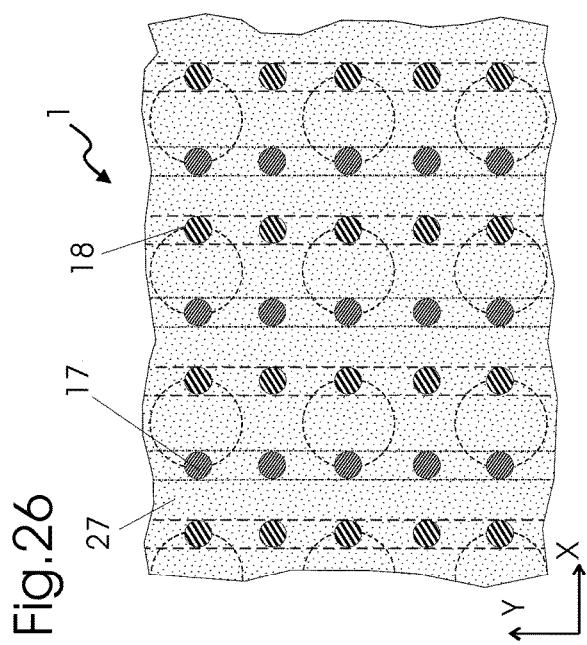
FIG. 28 is a diagram showing the electric field enhancement factor in the plane corresponding to line XXVIII-XXVIII in FIG. 27.

FIGS. 22-29 show another embodiment of an inventive photodetector 1, where a lateral p-i-n photodiode semiconductor structure 11 is incorporated into the subwavelength dielectric resonators. The resonator bodies 31 of the subwavelength dielectric resonators 30 are chosen to be of cylindrical shape and are also chosen to be arranged in a regular rectangular or square array. In this example of the invention, the cylindrical resonators 30 of the array are placed on top of a thin semiconductor layer 23 the thickness of which is approximately half the thickness of the cylindrical resonator body 31. The thin semiconductor layer 23 extends over the whole array area. The dielectric material of the intrinsic region 12 can be chosen to be germanium, for example, as may also be the material of the thin semiconductor layer 23 below. Finite-element method simulation of the electric field strength inside the resonator structure upon plane wave excitation reveals a collective resonant mode of the array that resembles a photonic crystal type mode with a spatially periodic pattern of strong electric field enhancement pattern in the semiconductor layer below the cylindrical resonator array. FIGS. 27 and 28 show the results of a corresponding finite-element method simulation of a square 3×3 cylindrical resonator array made of germanium. The electric field enhancement (up to a factor of 10) is predominately located in the germanium layer at the positions of the resonators, but also at positions in between neighboring resonators.

Figure 22:
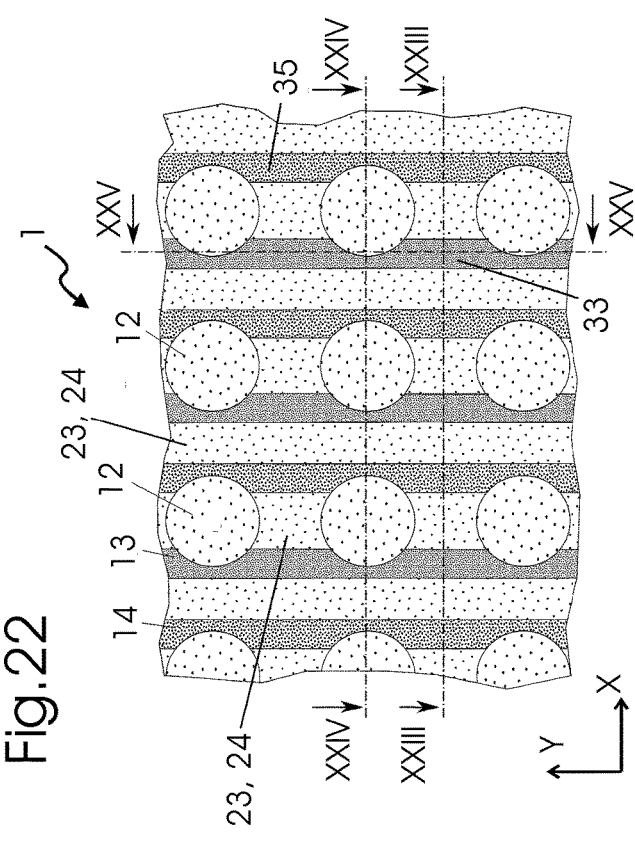
FIG. 22 is a top view of a sixth embodiment of an inventive photodetector.
Figure 25:
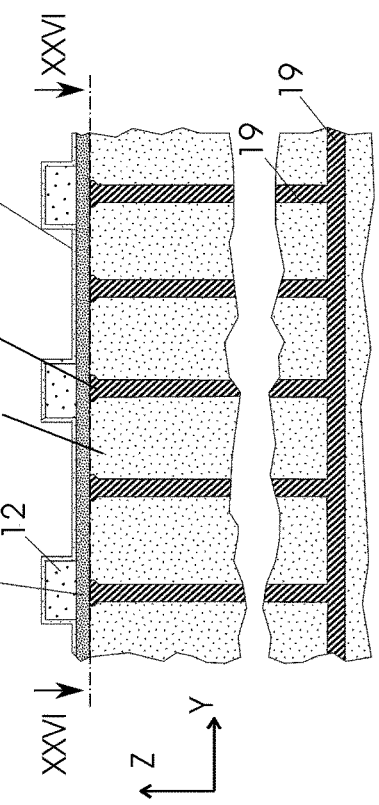
FIG. 25 is a sectional view according to the line XXV-XXV in FIG. 22.
Figure 24:
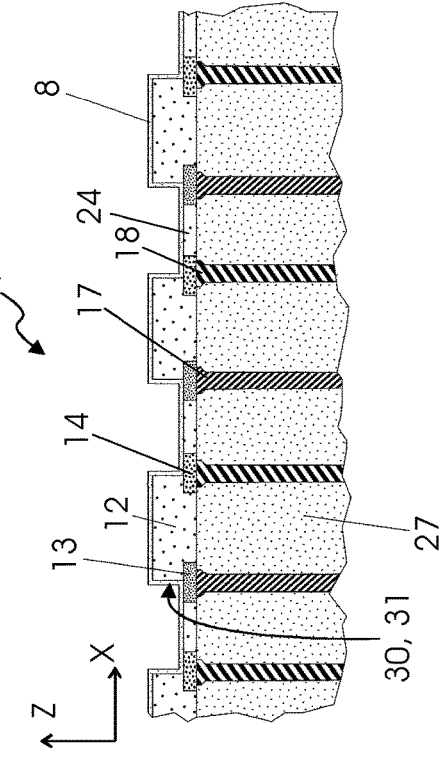
FIG. 24 is a sectional view according to the line XXIV-XXIV in FIG. 22.
Figure 29:
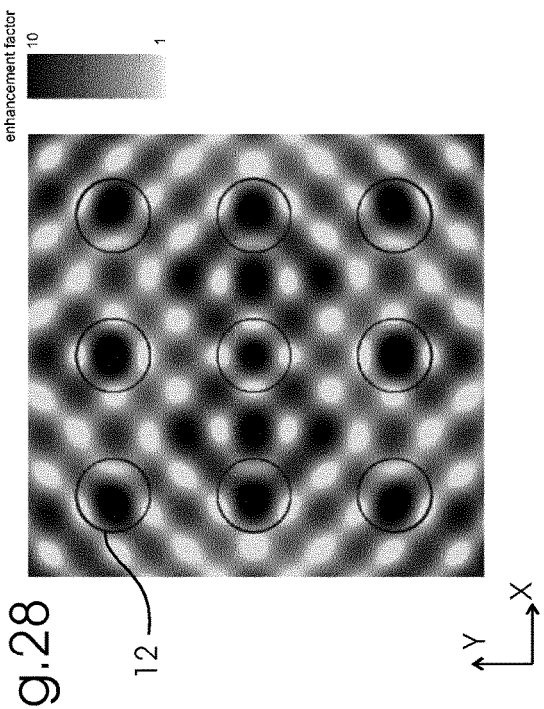
FIG. 29 is a diagram corresponding to FIG. 27 showing the electric field enhancement factor and indications of elements of the structure of the photodetector.

In order to exploit the regions with strong field enhancement in the germanium layer 23 under the cylindrical dielectric resonators 30 and between them for the generation of a photocurrent, p-doped regions (p-regions 13) and n-doped regions (n-regions 14) in the germanium layer 23 are arranged in stripes extending along the Y axis as shown in FIG. 22. Between two neighboring germanium resonators 30 on a line parallel to the X axis and between two neighboring stripe shaped p- and n-regions 13, 14 secondary intrinsic regions 24 extending in the Y axis are disposed in the semiconductor layer 23. Further secondary intrinsic regions 24 are disposed in the semiconductor layer 23 at the locations between two neighboring germanium resonators 30 on a line parallel to the Y axis and between two neighboring stripe shaped p- and n-regions 13, 14. As shown in FIG. 24, in X direction the p- and n-regions 13, 14 extend under the cylindrical resonators 30 for a part of their width and extend as well outside of the germanium resonators 30 for the rest of their width. In this way depletion zones are generated in the intrinsic region 12 of the germanium resonators 30 and below them in the undoped regions of the intrinsic semiconductor layer as well as in the secondary intrinsic regions 24. Along the X direction the semiconductor structure is a spatially periodic repetition of a double p-i-n photodiode semiconductor structure -p-i-n-i-p- in which each p- and n-region is shared by two neighboring p-i-n photodiode semiconductor structures. At the very bottom of the n- and p-doped regions 13, 14, narrow regions of p+- and n+-doping, respectively, are introduced, which have larger dopant concentrations such that ohmic contact can be realized at the interface with the metal electrodes 17, 18. The p- and n-regions 13, 14 are contacted via the narrow p+- and n+-regions to p- and n-electrodes 17, 18 respectively. The locations of the p- and n-electrode contacts are arranged in a dense grid under the semiconductor structure as shown in FIG. 26. In this way the photo-generated charge carriers in the different intrinsic regions of the semiconductor structure can be extracted quickly and efficiently. In FIG. 29 the greyscale representation of the electric field enhancement factor in the semiconductor layer is superimposed on a schematic drawing of the structure of the photodetector 1 indicating location of the regions of large field enhancement with respect to the locations of the p- and n-regions 13, 14, the intrinsic regions and the p- and n-electrodes 17, 18. The metal electrodes 17, 18 are embedded in a low index second supporting dielectric material 27 and are prolonged to a certain depth under the array of subwavelength resonators 30 where they are connected to a p-electrode circuit 19 and an n-electrode circuit (not shown), which are also embedded in the second supporting dielectric material 27 or another low index dielectric. The p- and n-electrode circuits make parallel connections between all p- respectively n-electrode 13, 14 resulting in a single p- and single n-connection terminal of the photodetector 1.

The fabrication of this embodiment can be realized in a similar way as the third embodiment that has been described with reference to FIGS. 13-16. The semiconductor layer 23 can be grown by epitaxy on a silicon dioxide layer on a silicon wafer. The silicon dioxide layer thereby functions as a sacrificial release layer for an epitaxial lift-off procedure. In order to form the p- and n-doped regions 13, 14 in the germanium layer, the epitaxial germanium growth process can be interrupted and ion implantation can be used to realize the desired semiconductor doping profiles. Subsequently, the epitaxial growth of the germanium can resume with the deposition of intrinsic germanium. Electron-beam lithography or photolithography can be employed to define the cylindrical mesas in the germanium layer thereby however keeping the germanium layer continuous in the areas between the mesas. After the embedding of the p-i-n dielectric resonator structure in a polymer layer (e.g. PMMA), which also serves as an adhesive to attach the processed structure at this stage to a handle wafer, the silicon dioxide layer below the germanium layer 23 may be etched away. Metal contacts can then be deposited at the designated locations to form ohmic contacts with the p+- and n+-regions. The volume between the electrodes 17, 18 may then be filled with a low index second supporting dielectric material 27, for example silicon oxide, silicon nitride or a spin-on polymeric dielectric. Similar to typical back-end-of-line processing in semiconductor device fabrication further parts of the p- and n-electrode circuits can be realized and embedded in layers of low index dielectric materials typically used in back-and-of-line processing. The polymer layer that attaches the generated structure to the handle wafer can then be dissolved and a passivation layer can be deposited over the exposed surfaces of the semiconductor structure, unless it was already deposited before the lift-off procedure.

Another fabrication procedure for this embodiment can consists in the realization of the metal electrode arrangement in the first place. Therefore, trenches can be etched into the dielectric material, such as e.g. silicon dioxide or silicon nitride, in order to form the electrode circuits which can be filled with the electrode material up to the point where they are designated to connect to the p- and n-region 13, 14 of the germanium layer. Subsequently, the germanium layer structure can be deposited on top as already describe above with subsequent etching of the cylindrical mesas by electron-beam lithography or photolithography. Again, a passivation layer can be deposited as last preparation step.

The invention claimed is:

1. A photodetector, comprising a two-dimensional arrangement of resonator-photodiode units disposed along a detector surface for detecting radiation incident from above the detector surface and having a target frequency that corresponds to a target wavelength in vacuum, wherein each resonator-photodiode unit comprises a photodiode semiconductor structure, which is sensitive to the target frequency, and a subwavelength dielectric resonator.

2. A photodetector according to claim 1, wherein the arrangement has a collective mode at the target frequency, in which a plurality of subwavelength dielectric resonators are coupled via electromagnetic fields.

3. A photodetector according to claim 1, wherein the photodiode semiconductor structure is a p-i-n photodiode semiconductor structure having an intrinsic region made of intrinsic semiconductor material, a p-region made of p-doped semiconductor material and an n-region made of n-doped semiconductor material, the p-region and the n-region forming a p-i and an n-i semiconductor junction, respectively, with the intrinsic region.

4. A photodetector according to claim 1, wherein a resonator body of the subwavelength dielectric resonator comprises the intrinsic region of the photodiode semiconductor structure.

5. A photodetector according to claim 1, wherein a distance between neighbouring resonator-photodiode units is at maximum twice the target wavelength.

6. A photodetector according to claim 1, wherein the p-region is connected to a p-electrode via a p+-portion and the n-region is connected to an n-electrode via an n+-portion, wherein the p+-portion and n+-portion have an increased dopant concentration and the p-electrode and n-electrode are adapted for extracting photo-generated free charge carriers from the p-i-n photodiode semiconductor structure.

7. A photodetector according to claim 1, wherein the p-region and the n-region are disposed on opposite sides of the intrinsic region along a direction perpendicular to the detector surface.

8. A photodetector according to claim 1, wherein a plurality of resonator-photodiode units are connected by a common p-region.

9. A photodetector according to claim 1, wherein an n-electrode is connected to a plurality of resonator-photodiode units.

10. A photodetector according to claim 1, wherein each resonator-photodiode unit is at least partially surrounded by at least one dielectric material having a refractive index smaller than that of the intrinsic region.

11. A photodetector according to claim 1, wherein the p-electrodes and the n-electrodes are disposed between the resonator-photodiode units with respect to the detector surface so that every resonator-photodiode unit is disposed adjacent to at least one p-electrode and one n-electrode.

12. A photodetector according to claim 1, wherein the p-regions and n-regions are connected in groups via the p-electrodes and n-electrodes, respectively, to portions of a p-electrode circuit and to portions of an n-electrode circuit that are disposed between the resonator-photodiode units along a first direction of the detector surface and that extend along a second direction of the detector surface.

13. A photodetector, comprising a two-dimensional arrangement of resonator-photodiode units disposed along a detector surface for detecting radiation incident from above the detector surface and having a target frequency that corresponds to a target wavelength in vacuum, wherein each resonator-photodiode unit comprises a photodiode semiconductor structure, which is sensitive to the target frequency, and a subwavelength dielectric resonator:
   wherein the photodiode semiconductor structure is a p-i-n photodiode semiconductor structure having a p-region, an n-region, and an intrinsic region made of intrinsic semiconductor material; and
   wherein the p-region and the n-region are disposed on opposite sides of the intrinsic region along the detector surface and at a lower end portion of the intrinsic region.

14. A photodetector, comprising a two-dimensional arrangement of resonator-photodiode units disposed along a detector surface for detecting radiation incident from above the detector surface and having a target frequency that corresponds to a target wavelength in vacuum, wherein each resonator-photodiode unit comprises a photodiode semiconductor structure, which is sensitive to the target frequency, and a subwavelength dielectric resonator:
   wherein the photodiode semiconductor structure is a p-i-n photodiode semiconductor structure having an intrinsic region made of intrinsic semiconductor material; and
   wherein the intrinsic regions are in groups connected to p-regions and n-regions that are disposed alternatingly between the intrinsic regions along a first direction of the detector surface and that extend along a second direction of the detector surface.

15. A photodetector according to claim 14, wherein secondary intrinsic regions are disposed between the p-regions and n-regions.

* * * * *